United States Patent
Rugg et al.

(10) Patent No.: US 12,188,995 B2
(45) Date of Patent: Jan. 7, 2025

(54) APPARATUS AND METHOD FOR MEASURING THICKNESS OF TUBINGS IN DOWNHOLE APPLICATIONS

(71) Applicants: Ryan Rugg, Cypress, TX (US); Alexander Tarasov, Houston, TX (US); Jinsong Zhao, Houston, TX (US)

(72) Inventors: Ryan Rugg, Cypress, TX (US); Alexander Tarasov, Houston, TX (US); Jinsong Zhao, Houston, TX (US)

(73) Assignee: GOWell International, LLC, Houston, TX (US)

( * ) Notice: Subject to any disclaimer, the term of this patent is extended or adjusted under 35 U.S.C. 154(b) by 184 days.

(21) Appl. No.: 18/084,047

(22) Filed: Dec. 19, 2022

(65) Prior Publication Data
US 2023/0221385 A1 Jul. 13, 2023

Related U.S. Application Data

(60) Provisional application No. 63/298,568, filed on Jan. 11, 2022.

(51) Int. Cl.
*G01R 33/00* (2006.01)
*G01B 7/06* (2006.01)
(Continued)

(52) U.S. Cl.
CPC ............ *G01R 33/0011* (2013.01); *G01B 7/10* (2013.01); *G01B 7/105* (2013.01); *G01R 33/0005* (2013.01); *G01R 33/0094* (2013.01); *G01R 33/038* (2013.01); *G01R 33/10* (2013.01); *G01V 3/107* (2013.01); *G01V 3/22* (2013.01); *G01V 3/24* (2013.01); *G01V 3/28* (2013.01); *G01V 3/30* (2013.01)

(58) Field of Classification Search
CPC ............ G01R 33/0005; G01R 33/0011; G01R 33/0094; G01R 33/02; G01R 33/038; G01R 33/10; G01V 3/105; G01V 3/107; G01V 3/18; G01V 3/20; G01V 3/22; G01V 3/24; G01V 3/26; G01V 3/28; G01V 3/30; G01B 7/10
See application file for complete search history.

(56) References Cited

U.S. PATENT DOCUMENTS

2019/0004202 A1* 1/2019 Yu .......................... G01V 3/081

FOREIGN PATENT DOCUMENTS

JP 2001289825 A * 10/2001

* cited by examiner

*Primary Examiner* — Justin Seo
*Assistant Examiner* — Kendrick X Liu
(74) *Attorney, Agent, or Firm* — Barry Choobin; Patent 360

(57) ABSTRACT

A magnetic flux measurement apparatus and method for nondestructive thickness imaging of metallic objects. The apparatus can primarily be used for thickness imaging of concentric metallic pipes, such as inner tubing and outer casing pipes in downhole applications. The magnetic flux measurement apparatus includes a transducer that includes a magnetic field source, magnetic flux sensor rings and a magnetic flux guide lens both positioned in alignment with a lateral axis of the magnetic field source. The magnetic flux guide lens is made of ferromagnetic material with high magnetic permeability that can direct flux lines into a predetermined sensor area for higher sensitivity and signal to noise ratio.

18 Claims, 13 Drawing Sheets

(51) Int. Cl.
*G01R 33/038* (2006.01)
*G01R 33/10* (2006.01)
*G01V 3/10* (2006.01)
*G01V 3/22* (2006.01)
*G01V 3/24* (2006.01)
*G01V 3/28* (2006.01)
*G01V 3/30* (2006.01)

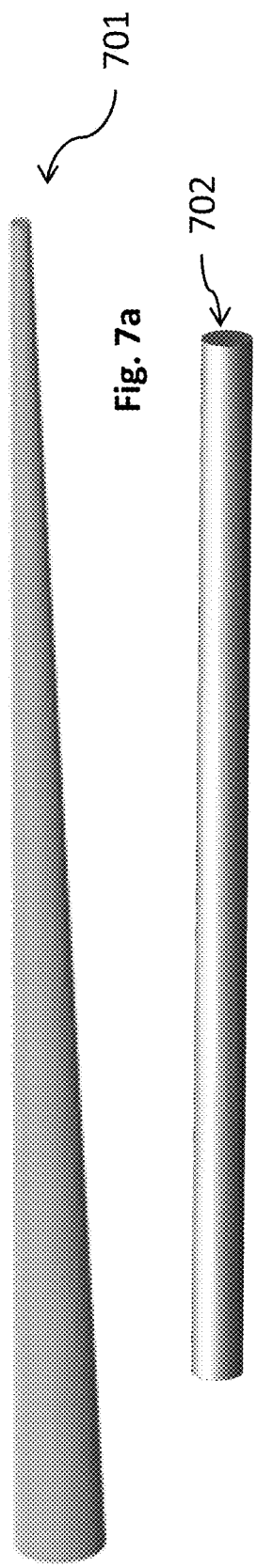
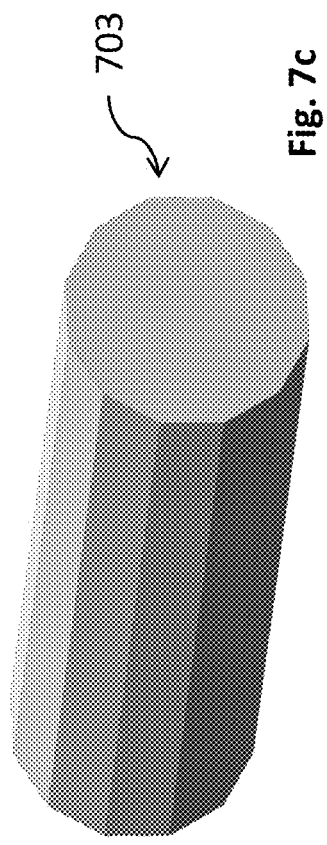
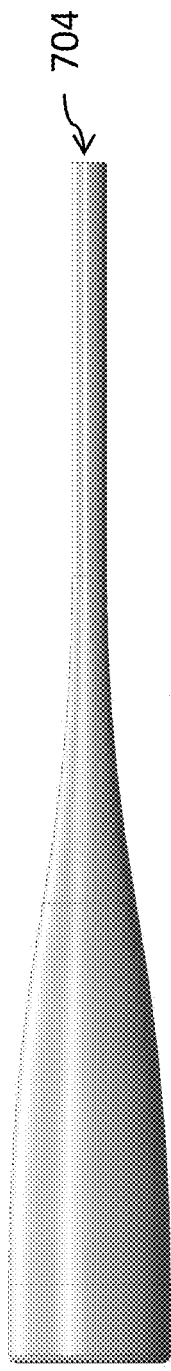
Fig. 7a  Fig. 7b  Fig. 7c  Fig. 7d

APPARATUS AND METHOD FOR MEASURING THICKNESS OF TUBINGS IN DOWNHOLE APPLICATIONS

CROSS-REFERENCE TO RELATED APPLICATIONS

This application claims priority from a U.S. provisional patent application Ser. No. 63/298,568, filed on Jan. 11, 2022, which is incorporated herein by reference in its entirety.

FIELD OF INVENTION

The present invention relates to an apparatus and method for estimating thickness of metallic objects, and more particularly, the present invention relates to an apparatus and method for nondestructive and non-contact estimation of thickness and thickness imaging of metallic objects, such as concentric metallic pipes.

BACKGROUND OF THE INVENTION

Magnetic flux measurement and testing methods for non-contact and non-destructive evaluation of metallic objects are being widely used in industries. Such methods are critical in downhole logging applications where multiple concentric pipes are located beneath the surface and are inaccessible to any other testing methods. In downhole logging, the inner and outer concentric pipes are universally called tubing and casing pipes respectively. Installation and maintenance activities primarily require inspection of thickness measurements of both tubing and casing pipes to monitor their integrity. Such thickness measurements are critical for the overall well reliability and performance and are required to ensure that downhole pipes are free of cracks and corrosion effects that can result in catastrophic consequences if left unmaintained.

In general, magnetic flux measurement technology employs a transducer that contains both the transmitter module which generates a strong initial magnetic field needed to magnetize surrounding ferromagnetic-metallic objects, such as carbon-steel pipes and a receiver that can measure flux density variations corresponding to pipe thickness changes. In a conventional form, magnetic flux measurement transducers face many challenges associated with multi-pipe thickness imaging measurements. In some existing solutions which employ the magnetic flux leakage principle to analyze the thickness of the outer casing pipe, the inner tubing pipe needs to be removed from the well before measurement. This is done because the transducer needs to be positioned very close to the inner surface of the casing pipe during measurement to maintain a high enough signal-to-noise ratio to be able to deliver thickness imaging. However, the removal process of the tubing pipe is very costly. A large amount of time and equipment, such as a rig is needed, which significantly increases the time required to complete pipe thickness measurement, analysis, and evaluation. Keeping the well operations suspended for maintenance significantly adds to the maintenance cost. Thus, avoiding the need of removing the inner pipes in downhole maintenance activities is always desired for saving both time and cost.

Solutions exist in the art, such as through-tubing thickness evaluation wherein both the tubing and casing pipes can be analyzed while the tubing pipe remains intact within the casing in the borehole. The transducer module is normally placed and centralized inside the tubing pipe and can measure the thickness of both the tubing and casing pipes. However, the through-tubing thickness evaluation suffers from one or more drawbacks or limitations.

Primarily, such methods do not provide thickness imaging measurements but can only measure and deliver average thicknesses of metallic objects. The known methods employing electromagnetic Omni-coil transducers can only provide an average thickness due to their lack of finite azimuthal resolution and sensitivity to small thickness variations necessary to build the imaging profile of pipes.

Consequently, there is a need for an improved magnetic flux transducer design and method that can deliver high-resolution thickness imaging for tubing and casing pipes while maintaining a high signal-to-noise ratio (SNR) and sensitivity.

BRIEF SUMMARY OF THE INVENTION

The following summary briefly introduces the present invention and its preferred embodiments so that a further detailed description can be better understood. This summary neither specifies nor focuses on any specific characteristics of the present invention or its embodiments; Its sole purpose is to introduce the invention in a simplified form as a prelude to the more detailed description.

It is an object of the present invention to provide the solution to thickness measurement challenges of concentric tubular metallic objects presented above by developing a magnetic transducer module that incorporates magnetic flux sensor rings with a built-in novel magnetic flux guide lens to allow thickness imaging of tubing and casing pipes in downhole applications.

It is another object of the present invention to provide a magnetic transducer apparatus that is capable of through-tubing thickness imaging measurements for both inner and outer pipes with the transducer positioned inside the inner tubing pipe, thus eliminating the need for tubing pipe withdrawal prior to casing pipe thickness measurement.

It is another object of the present invention to provide a magnetic transducer that possesses the ability to measure tubing and casing thickness imaging with high azimuthal resolution and sensitivity while maintaining high signal to noise ratio (SNR).

It is another object of the present invention to provide a method to compress excitation magnetic field to force higher density flux field to flow through inner tubing and outer casing pipes as to further enhance magnetic flux sensor rings' sensitivity and SNR.

It is another object of the present invention to provide a method to enhance the azimuthal resolution of the sensor rings by means of physically arranging sensor rings in a specific way and using interpolation in the postprocessing domain.

In one aspect, disclosed is a magnetic flux measurement transducer apparatus capable of measuring tubing and casing pipe thicknesses and delivering pipe image profiles while being positioned inside the tubing pipe. The disclosed apparatus contains a strong magnetic source transmitter that may be composed of rare-earth magnets that is required to provide strong initial magnetic field to magnetize surrounding metallic pipes. The disclosed apparatus includes receiver magnetic flux sensor rings, also referred to herein as sensor ring(s), which may sense flux density distribution variations corresponding to pipe thickness changes. Such sensor rings may output multiple analog voltages in response to changes in magnetic flux density. A circuit that contains analog and digital electronic networks such as amplifiers, resistors, capacitors, analog-to-digital converters, and other components necessary to receive, condition, scale, and process such analog voltages is connected to the magnetic flux sensor rings. The magnetic flux sensor rings are positioned at a certain lateral spacing distance away from the magnetic source transmitter. A magnetic guide lens is positioned along the length of receiver magnetic flux sensor rings in order to enhance sensitivity and balance signal dynamic range for magnetic flux reception from tubing and casing pipes.

In one aspect, disclosed are a magnetic flux measurement apparatus and a method for nondestructive thickness imaging testing of metallic objects, the magnetic flux measurement apparatus comprises a transducer comprising at least one magnetic field source; one or more magnetic flux sensor rings spatially positioned in alignment with a lateral axis of the at least one magnetic field source; and a magnetic flux guide lens operably coupled to the at least one magnetic field source and passes through the one or more magnetic flux sensor rings in alignment with the lateral axis of the at least one magnetic field source. The at least one magnetic field source is a permanent magnet or an electromagnet. The magnetic flux guide lens is coupled to a south or a north pole of the at least one magnetic field source.

The magnetic flux measurement apparatus according to claim 1, wherein the magnetic flux measurement apparatus further comprises a secondary magnetic field source spatially positioned geometrically at a predetermined distance away from the at least one magnetic field source in alignment with the lateral axis such that magnetic fields of the secondary magnetic field source and the at least one magnetic field source oppose each other.

In one implementation, each ring of the one or more magnetic flux sensor rings comprises a body having evenly spaced apart magnetic flux sensors disposed throughout a periphery of the body in azimuthal direction for obtaining azimuthal spatial image measurements. The one or more magnetic flux sensor rings are spatially positioned along the lateral axis with predetermined spacings among them. The at least two magnetic flux sensor rings of the one or more magnetic flux sensor rings that are adjacent to each other are oriented at a predetermined angular offset relative to each other for enhancing azimuthal resolution.

In one implementation, the magnetic flux guide lens is made of ferromagnetic materials with high magnetic permeability, the material selected from a group consisting of iron, nickel, cobalt, and a combination thereof. The magnetic flux guide lens is coupled to a north pole or a south pole of the magnetic field source and is configured to guide magnetic field flux lines into a predetermined sensor area of the one or more magnetic flux sensor rings and aligning flux incidence angles in a radial direction. The magnetic flux guide lens is of a tapered profile, wherein the magnetic flux guide lens has a proximal end and a distal end, the proximal end is coupled to the magnetic field source, the magnetic flux guide lens tapers from the proximal end towards the distal end.

In one aspect, the one or more magnetic flux sensor rings are spatially located along the lateral axis with predetermined spacings among them and from the first ring to the polarized end of magnetic source for lateral spatial resolutions of the image measurements.

The following summary has briefly introduced the invention principle and arrangement of its preferred embodiments such that the detailed description presented later will be understood more easily. It should be understood that any of the aforementioned embodiments may be changed or modified as long as such modifications remain within the scope of the claims presented later. It should also be noted that the embodiments described in this summary do not depart from the overall scope and purpose of this invention.

BRIEF DESCRIPTION OF THE DRAWINGS

The following section below provides a brief overview of the drawings accompanying the present invention so that the technical characteristics of the invention along with its advantages can be easily understood.

FIG. 4 further illustrates the concept of utilizing the aforementioned guide lens placed along the lateral direction of multiple sensor rings to enable a differential measurement of the flux distribution from inner and outer pipes in order to enhance system performance and sensitivity.

FIG. 7a shows a magnetic flux guide lens of a tapering profile, according to an exemplary embodiment of the present invention.

FIG. 7b shows a magnetic flux guide lens of a cylindrical profile, according to an exemplary embodiment of the present invention.

FIG. 7c shows a magnetic flux guide lens of a polygonal profile, according to an exemplary embodiment of the present invention.

FIG. 7d shows a magnetic flux guide lens of a conical and tubular profile, according to an exemplary embodiment of the present invention.

DETAILED DESCRIPTION OF THE INVENTION

Figure 1:
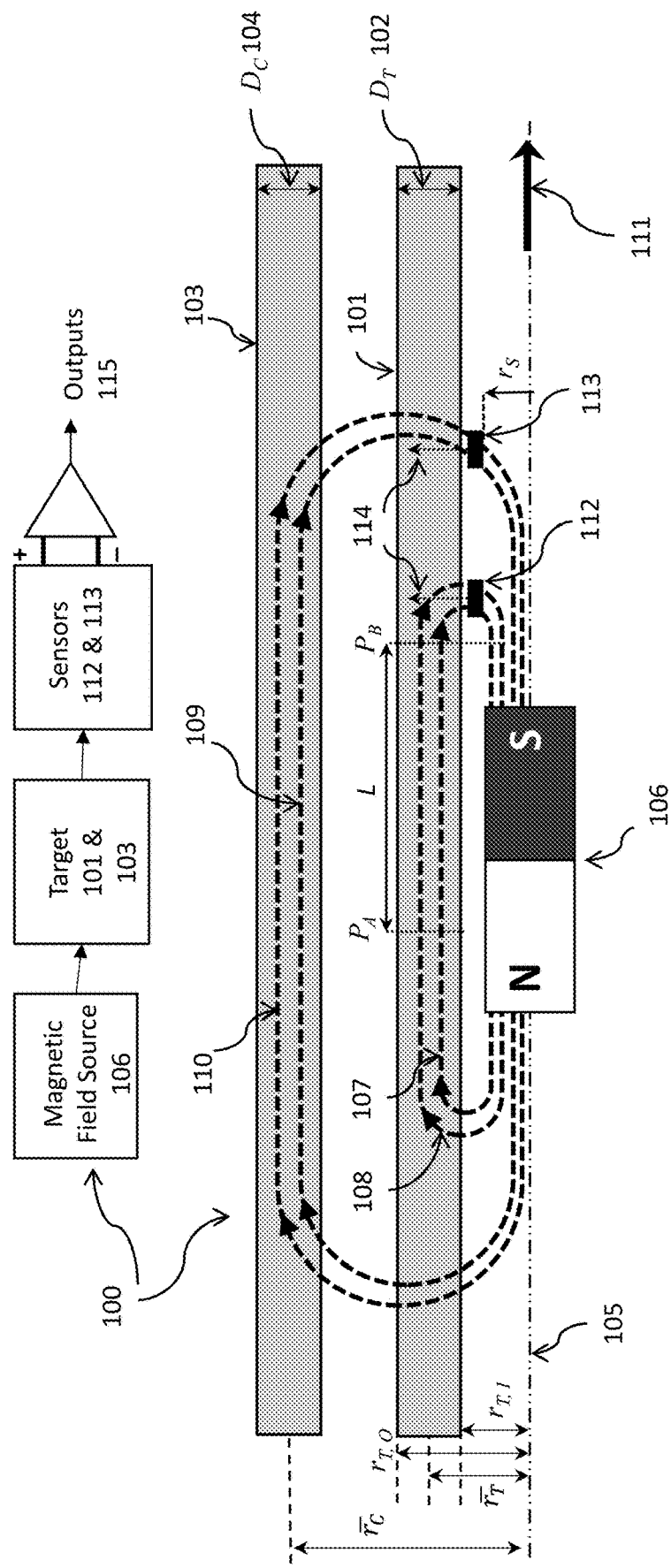
FIG. 1 is a schematic diagram illustrating the concept and scheme of operation of through-tubing multiple-pipe thickness measurements employing magnetic flux measurement principle as known in art.

The subject matter will be now described in full detail and will employ accompanying drawings to aid in understanding of the invention and its advantages. It should be understood that the presented detailed description of the preferred embodiments should not be construed in any way as limiting but is rather meant to be illustrative of the concept and advantages of the present invention. It should be noted that the preferred embodiments described herein can be modified in any shape or form so long as they remain within the scope of claims of the present invention. This description therefore should be viewed in a broad scope sense.

When referring to the embodiments as "preferred" or "exemplary", such references are only meant to indicate that a particular arrangement of the embodiments depicted in the accompanying drawings is being described. Such an arrangement shall thus not be viewed as more advantageous over other arrangements of the embodiments.

Any specific terms and sentence structures used below are only used for the purpose of describing the present invention and are not meant to limit or constrain the embodiments of the present invention. For example, any singular terms that may be used while describing certain parameters of the embodiments such as "a", "an, or "the" can also include plural forms unless specifically stated otherwise. Additionally, the particular way of describing embodiments does not, in any way, prevent any additions, modifications or removal of some features, methods or components to or from the existing embodiments as long as such changes do not depart from the scope of the present invention that will be declared and defined in the claims section of the patent. Therefore, the following description is not to be viewed in a limiting sense, but rather in a merely illustrative sense.

Disclosed are an apparatus and a method for thickness imaging of ferromagnetic tubular objects using the principles of magnetic flux measurement. In particular, the disclosed apparatus and method can be used for thickness imaging of both the inner and outer downhole carbon-steel pipes. The disclosed apparatus can perform thickness imaging measurements through the tubing without the need to remove any inner pipe. The disclosed apparatus can be positioned inside the inner tubing for thickness imaging of both the inner tubing and outer casing pipes in the downhole applications and with a high degree of spatial resolution and sensitivity.

The disclosed apparatus can include a magnetic transducer that may include a magnetic field source for transmitting magnetic flux field. The magnetic transducer may further include multiple magnetic flux sensor rings for sensing the magnetic flux distribution variations. The magnetic transducer may further include a magnetic flux guide lens that may enhance sensitivity and SNR of the sensor rings. In certain implementations, an additional magnetic field source may also be added for compressing the primary magnetic field to further enhance sensitivity and SNR. It is understood that the disclosed magnetic transducer can include more than one magnetic field source that is are arranged along a lateral axis for enhancing the overall primary magnetic field strength.

The magnetic field generation source may be composed of strong rare-earth magnets capable of generating a permanent and static magnetic field in order to magnetize the surrounding metallic tubular objects and induce initial flux distribution along the inner and outer pipes. The magnetic flux sensor rings may comprise of multiple rings of magnetic flux sensors capable of sensing changes in magnetic flux distribution arriving from the casing and tubing. The magnetic flux guide lens may comprise of high magnetic permeability material capable of guiding the magnetic flux towards the sensor rings. The magnetic flux guide lens may be shaped in a particular geometry or profile as dictated by engineering designs and requirements. The magnetic flux sensor rings may generate analog output voltages in response to changing magnetic flux density depending on pipe thickness variations. A circuit containing necessary analog and digital networks such as amplifiers, capacitors, resistors, analog-to-digital converters, and other networks that are used to receive, condition, and digitize such analog voltages may be connected to the sensor rings. Postprocessing methods and algorithms may be used to process and enhance the received data from the said magnetic transducer module in order to generate high azimuthal resolution and high-sensitivity tubing and casing thickness images.

FIG. 1 depicts a cross section 2D view of a conventional magnetic transducer and principles that employs magnetic flux density measurement system 100 as known in the art for performing multi-pipe thickness measurements. The transducer, including passive (such as a permanent magnet) or active (such as a coil driven with DC current) magnetic field generation source 106 and sensor rings 112 and 113, is positioned inside its measurement environment such as multiple cylindrical metallic pipes, including tubing 101 and casing 103, that are located downhole in a production well. The said apparatus is placed inside the inner tubing pipe 101 with a certain wall thickness $D_T$ 102 and is normally centralized along the tubing cylindrical lateral axis 105. The outer casing pipe 103 with a certain wall thickness $D_C$ 104 is placed concentrically outside of the inner tubing pipe 101. Both tubing thickness $D_T$ 102 and casing thickness $D_C$ 104 reduce over time as the production well ages due to various reasons such as chemical corrosion, mechanical erosion, etc. Consequently, pipe thickness inspection and evaluation must be conducted regularly to make sure well integrity and safety of production operations are preserved. When the said inspection apparatus, the transducer module, is placed inside the measurement target metal pipes, 101 and 103, the magnetic flux flows out from the "north" pole of the magnetic generation source 106, passes through the measurement target tubing 101 and casing 103 individually and proportionally, passes across the sensor rings 112 and 113 that are positioned to measure flux density distributions from tubing 101 and casing 103, and returns back into the "south" pole of the magnetic field generation source 106, thus forming a closed loop magnetic flux path as illustrated. Altogether, it forms a measurement system 100. In the measurement system 100, the sensor ring signal measurements, in principle, correspond to the changes of the tubing thickness 102 and casing thickness 104. As stated, when the transducer module is placed inside the target 101 and 103, a magnetic field source 106 produces a magnetizing force H around it, which forms a closed loop magnetic flux density vector field B in the surrounding environment. The flux travels from one pole of the magnetic source to the other, as described by Maxwell's equations. The relationship between the two fields follows:

$$B = \mu H \quad (1.1)$$

$$\mu(B) = \frac{dB}{dH} \quad (1.2)$$

Theoretically, the corresponding magnetic B field flux density distribution can be established and shall be proportional to the magnetizing force and the permeability of the surrounding environment. As the permeability of a ferromagnetic metal pipe is much higher (tens to hundreds of times) than the permeability of air or fluid, the density of magnetic flux will be higher accordingly in the metal than in the air or fluid. Moreover, the majority of magnetic flux is concentrated around the path of least magnetic reluctance R. The reluctance R of a closed loop magnetic B field follows $$R = \frac{A}{\Phi} \quad (2.1)$$

$$A = \oint_L H \cdot dl \quad (2.2)$$

$$\Phi = \int\int_S \mu H \cdot ds \quad (2.3)$$

Wherein A is the magnetic potential that drives a certain amount of magnetic flux $\Phi$ within the surface of S moving forward along the distance L, shown in FIG. 1. Considering the cylindrical ferromagnetic tubing 101 and casing 103 configured symmetrically, the cross-section area $S_T$ for tubing 101 can be calculated with $$S_T = 2\pi \overline{r_T} \cdot D_T \quad (2.4)$$

$$\overline{r_T} = \frac{r_{T,I} + r_{T,O}}{2} \quad (2.5)$$

$$D_T = r_{T,O} - r_{T,I} \quad (2.6)$$

Where $\overline{r_T}$ is the average value of the nominal radius of tubing 101 while $r_{T,I}$ and $r_{T,O}$ are the tubing inner surface nominal radius and outer surface nominal radius, respectively. As illustrated in FIG. 1, the magnetic reluctance inside tubing 101 pipe from points $P_A$ to $P_B$ across the distance L, will be derived from Equations (2.1) to (2.6). That is, $$R_{T,L} = \frac{A}{\Phi} \approx \frac{\tilde{H}L}{\mu \tilde{H} S_T} = \frac{1}{2\pi \overline{r_T}} \cdot \frac{L}{\mu \, D_T} \quad (2.7)$$

The total reluctance $R_T$ of the flux line loops $\Omega_T$ for 107 and 108 can be obtained by integrating the complete loop together for $$R_T = \oint_{\Omega_T} \left(\frac{1}{\mu \, S_T}\right) dl = \frac{1}{2\pi \overline{r_T}} \oint_{\Omega_T} \left(\frac{1}{\mu \, D_T}\right) dl \quad (2.8)$$

Similarly, the reluctance $R_C$ for flux line loops, 109 and 110, can be calculated using Equation (2.8) in which $\mu$ is the permeability of a material along the flux loop path and $D_T$ is the thickness of the metal pipe. In principle, based on the Equation (2.8) and given the nominal values of pipe geometry and magnetic permeability, the flux loop reluctance can be established. Since reluctance is inversely proportional to the permeability of the material, higher permeability results in a low reluctance path and thus higher flux density concentration of the B field. In general, the permeability of ferromagnetic pipes, including both tubing 101 and casing 103, is much higher than that of the air or fluid in the surrounding environment. Therefore, a higher density of magnetic field flux lines will concentrically travel through the metal pipes than through the air or fluid. Magnetic field B flux lines 107 and 108 are shown traveling through the tubing pipe 101 while magnetic field B flux lines 109 and 110 are shown traveling through the casing pipe 103. When magnetic source 106 establishes initial magnetic field B upon being placed in the target, most of the B field flux is concentrated and travels along the tubing pipe 101 as it is physically located closer to the magnetic source 106 and thus offers lowest reluctance R path to the magnetic field flux lines as the air-gap distance between tubing pipe 101 and magnetic field source 106 is shorter than the one between the casing pipe 103 and magnetic field source 106. However, Equation (1.2) also shows that the permeability of ferromagnetic metals is a function of the B field inside the metal, which will saturate gradually for $\mu(B)$ along with the increase of the B field and will eventually tend to zero as B field continuously increases. As the result of the permeability reduction due to B field increase, the magnetic flux reluctance R will increase for a given material thickness $D_T$, according to Equation (2.8). In general, magnetic saturation level is mainly dependent on the type of ferromagnetic material used for manufacturing tubing 101 and casing 103 pipes. The reduction of permeability can be calculated using a hysteresis B-H curve of a particular ferromagnetic material. Magnetic reluctance increase along the B field flux lines' path then forces some of the B field flux lines 109 and 110 to travel through the next region of lower reluctance and higher permeability as compared to the saturated tubing 101 region, which, as shown in the FIG. 1, is the outer casing pipe 103. Over time, the permeability of casing 103 will show similar reduction behavior as the permeability of tubing 101, based on Equation (2.8). Even still, due to the finite magnetizing force H that the magnetic field source 106 can generate and thus a finite flux density field B that can be induced into the target pipes 101 and 103, the B field flux lines 107 and 108 traveling along the path of the tubing pipe 101 will have higher flux density than the B field flux lines 109 and 110 traveling along the path of casing pipe 103 as it takes relatively high flux density field B to gradually saturate the tubing pipe 101 and force the B field to travel along the casing pipe 103. Eventually, the density distribution of flux lines 107, 108, 109, and 110 both in the tubing 101 and casing 103 reaches an equilibrium state governed by the differences of pipe magnetic reluctances given the nominal values of the pipe thicknesses $D_T$ 102 and $D_C$ 104, respectively. Any changes of thickness(es) 102 and/or 104 from either the tubing 101, the casing 103, or both will change the balance of reluctances, as shown in Equation (2.8), which will break the equilibrium state and cause the flux density to rebalance based on new reluctance difference distributions. Eventually, a new equilibrium state will be achieved. Similarly, the azimuthal thickness changes also trigger the rebalance of the flux density distribution azimuthally. Therefore, the 2D thickness images for $D_T$ and $D_C$ in azimuthal and lateral directions for both the tubing 101 and casing 103 pipes can be made possible to measure. It therefore follows that differences of the flux density distributions in azimuthal and lateral directions that correspond to pipe thickness changes according to Equation (2.8) can be measured with the sensor rings 112 and 113.

Magnetic flux sensor rings 112 and 113, with multiple sensors per ring, are generally placed azimuthally along the lateral direction z-axis of the magnetic transducer. They can measure variations in the flux density distributions, both in azimuthal and in lateral, of 107, 108, 109 and 110 flux lines that correspond to reluctance R changes determined by the permeability and the pipe thickness changes, as shown in Equation (2.7). The sensor rings 112 and 113 are able to measure in the radial direction 114 (sensor measurement direction) of the incoming B field flux lines 107, 108, 109, and 110. The sensor ring 112 may be placed closer to the magnetic field source 106 to sense the inner tubing 101 B field density of the flux lines 107 and 108, while the sensor ring 113 may be placed farther away from the magnetic source 106 to be able to sense outer casing 103 B field density of the flux lines 109 and 110. Suitable magnetic flux density measurement sensor rings that the sensor ring may consist of can be generally of various types such as the Hall effect sensor and others, depending on engineering designs and requirements. The magnetic transducer apparatus may either remain stationary while performing thickness measurement outputs 115 or move in the logging direction 111 along the lateral z-axis 105 of the inner tubing pipe 101.

Figure 2:
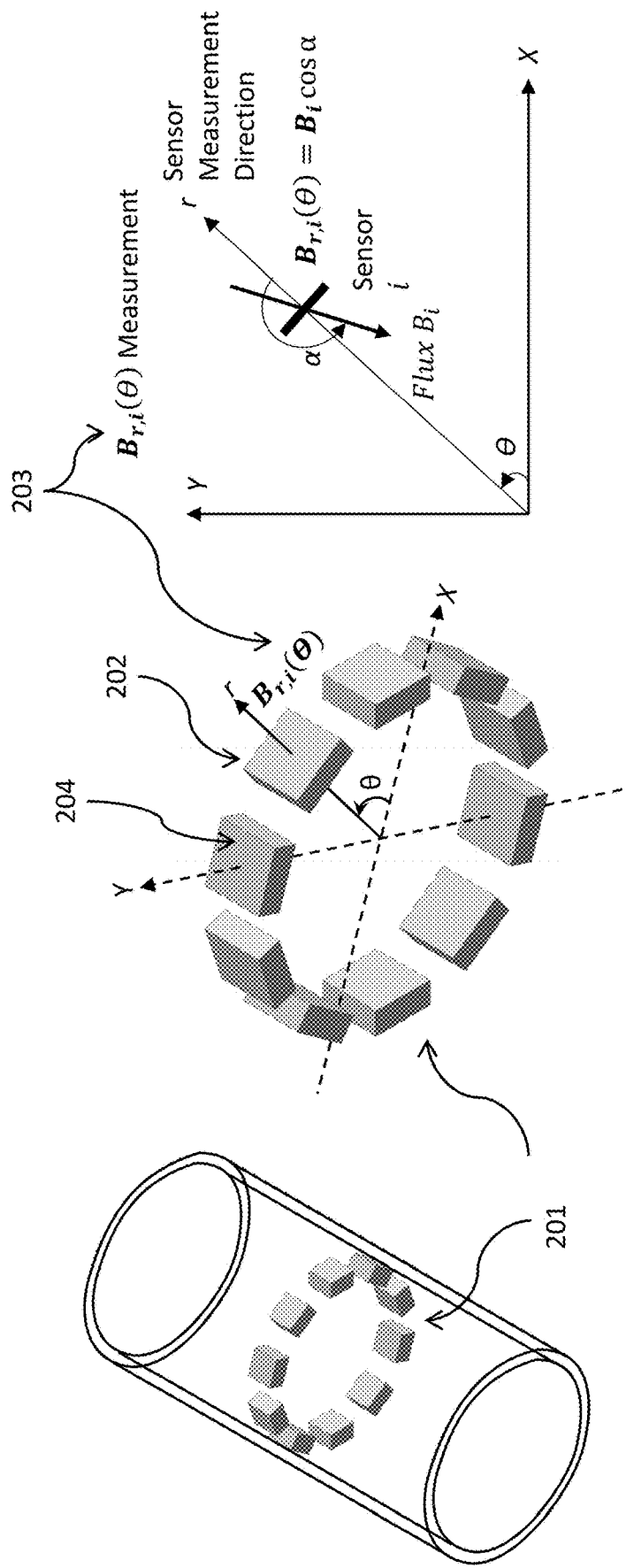
FIG. 2 is a schematic diagram illustrating a principle of flux density measurement using the magnetic flux sensor ring arranged in a circular profile as part of a typical transducer apparatus designed for thickness imaging measurements inside cylindrical objects such as downhole pipes as known in art.

FIG. 2 illustrates a general arrangement of the magnetic flux receiver sensor ring, such as 112 or 113, positioned inside the magnetic flux measurement transducer apparatus for thickness imaging measurement that produces outputs 115. Each sensor ring is generally arranged in a circular ring-shaped azimuthal ring 201 (Sensor Ring with Spatial Azimuthal Resolution in degree of 2π divided by the number of sensors per ring) in which each of the individual sensors 202 is positioned in the radial direction with a certain azimuthal spacing between the adjacent two sensors in order to acquire flux density measurements 203 with a high azimuthal resolution. Each of the individual sensors 202 senses the radial component $B_r$ of the B field flux traveling along the circumference of circular pipes, such as the tubing 101 and the casing 103, as shown in FIG. 2, which is $$B_{r,i}(\theta)=B_1 \cos \alpha \qquad (3.1)$$

Given the fixed sensor surface area 204, the sensor measures the total amount of flux passing through its area 204, and outputs a signal that corresponds to the magnetic $B_r$ flux density. A full sensor ring 201 can provide B field measurements with spatial azimuthal resolution that follows:

$$\text{Sensor Ring Resolution in radians} = \frac{2\pi}{N} \qquad (3.2)$$

wherein, N is the number of sensors 202 placed around the circular ring 201. From the Equation (3.2) above, it is evident that the higher number of sensors 202 per sensor ring 201 results in higher azimuthal resolution of the said ring.

Figure 3A:
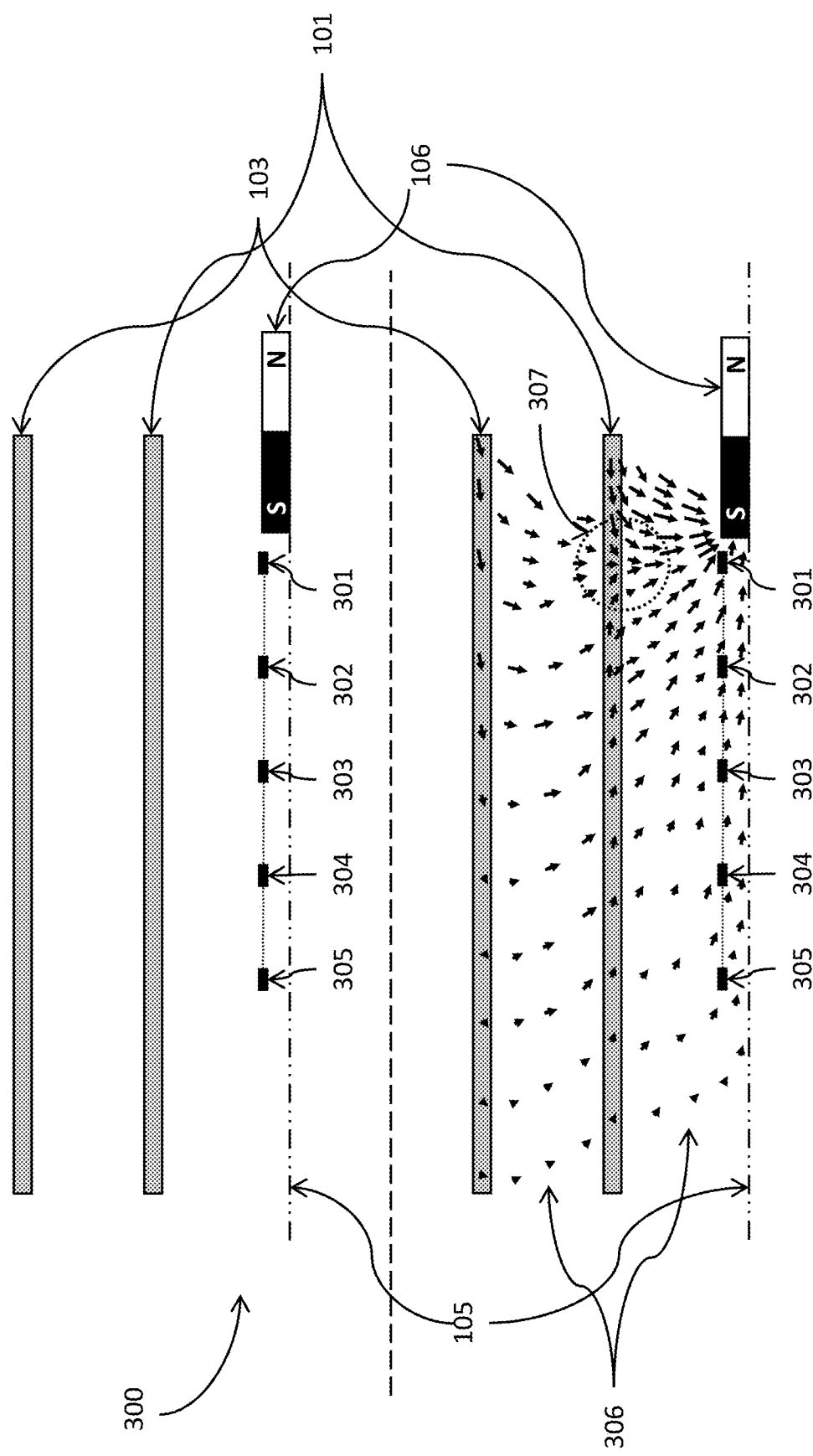
FIG. 3a is a block diagram illustrating the principal challenges and limitations of the flux density measurement configurations which makes it impossible to obtain the through-tubing measurements, reliably, of the casing pipe due to lack of enough signal sensitivity and SNR from the casing, as known in art.

FIG. 3a illustrates major challenges associated with through-tubing thickness imaging measurements of both tubing 101 and casing 103 and highlights reasons for lack of sensitivity and SNR as major limitations with the approaches shown in FIG. 1. A cross section view of the magnetic flux distributions 306 and the magnetic transducer configuration 300 (Sensor Matrix Configuration) introduced in FIG. 1 is illustrated and analyzed in detail. The magnetic B field flux distribution 306 is shown as the cluster of small arrows based on the simulation results from Finite Element Method (FEM) modeling. The lengths of arrows represent the flux density level while the directions of arrows show the flux flow orientations. The magnetic transducer module is located in the same measurement environment as described in FIG. 1—centralized inside the tubing 101 along its axis 105 with the outer casing 103 placed concentrically outside of the tubing 101. The sensor rings, shown in FIG. 2, are placed a certain distance away from the magnetic field source 106 and comprise of five separate sensor rings 301, 302, 303, 304 and 305 that measure the magnetic distribution flux densities at each of the sensor locations on the rings with M number of individual sensors per ring and total N number of rings. This arrangement results in the measurement output matrix of $[B_{r,i,j}(\theta)]_{N \times M}$ in the radial direction of B field flux lines 306 that is composed of the output element on i-th sensor from 1 to M of the j-th ring from 1 to N. The number of rings is chosen to be illustrative and may be different as dictated by different engineering designs. The B field flux lines 306 travel through the tubing 101 and casing 103 with a higher flux density concentration along the tubing 101. In principle, as B field lines 306 return to the magnetic field source 106, they follow the path of lower reluctance to reach an equilibrium state, as illustrated in FIG. 1.

Region 307 indicates the location of half the distribution of the flux lines 306 from the tubing 101 and half the distribution of the flux lines 306 from the casing 103. The location of the "half-half" region 307 is critical as it can be used to determine the locations and spacings of each of the sensor rings based on engineering requirements for balancing signal sensitivity, SNR, and z-axis spatial resolution for thickness changes for both tubing 101 and casing 103. In principle, any sensor rings located to the right side of the region 307, close to from the magnetic source 106, measure the returning flux lines 306 from the tubing 101 while any sensor rings located to the left side of this region, far away from the magnetic source 106, measure the returning flux lines 306 from the casing 103. The sensor ring right underneath the region 307 measures the combination of half-half flux lines 306 from both tubing 101 and casing 103.

In FIG. 3a, the FEM simulation results also show that, for a majority of the B field flux lines 306, the return path of least reluctance is in the area near the south pole of the magnetic source 106 passing through right side of the region labeled in 307. That is, the majority of B field flux lines 306 traveling through tubing 101 and casing 103 will follow the path of return through the area on the right side of region 307 as they complete the closed loop flux paths. As shown in FIG. 3a, the sensor ring 301 is placed with the shortest spacing to the region 307 and the south pole of the magnetic field source 106 and will have the highest sensitivity and SNR for measurements, as compared to the other sensor rings from 302 to 305. However, the B field flux lines 306 passing through the area on the right side of the region 307 to sensor ring 301 are mainly dominated by magnetic flux lines returning from the tubing pipe 101 due its higher flux density concentration as the result of its overall lower reluctance of the flux loop. Consequently, the sensor ring 301, located closest to the magnetic source 106, is highly sensitive to the B field flux lines with the dominant density of these lines arriving from the tubing pipe 101 and very little remaining density arriving from the casing pipe 103. The rest of the sensor rings from 302 to 305 are located farther to the left side of region 307 where most or all of the flux lines 306 are returning from the casing 103 with very low density, which results in low signal sensitivity in measurements. As distance from the magnetic source 106 increases, the reluctance in the return path of the B field flux lines 306 arriving from the casing pipe 103 increases, the flux density decreases, and, as the result, the signal sensitivity also decreases. Due to the low sensitivity, the SNR for measuring flux density changes corresponding to casing 103 thickness changes for rings 302 to 305 will be very low in the configuration shown in FIG. 3a.

Moreover, the FEM modeling results also reveal that the B field flux lines pass through sensor ring rings from 301 to 305 at a high incidence angle α, shown in FIG. 2, which rapidly reaches close to a perpendicular angle. According to Equation (3.1), the output signal levels from sensors measuring flux lines at a high incident angle α will be low, which also contributes to a much worse sensitivity and SNR, especially for the sensor rings from 302 to 305. Due to the combination of both the low-density concentration of flux lines from the casing pipe 103 and their high incidence return angles that pass through the sensor rings in the area to the left side of the region 307, the sensor rings 302, 303, 304 and 305 exhibit a very low sensitivity and poor SNR.

A need is therefore appreciated for an improved apparatus that can boost the overall B field flux density levels by shifting the region 307 to the left, near the sensor ring 303, in the center area. Such a shift can then balance the flux density distribution where the measurements from sensor rings 301 and 302 will correspond to the tubing 101 thickness changes while the measurements from sensor rings 304 and 305 will correspond to the casing 103 thickness changes. It can also be shown that this improvement can be used to enhance the lateral z-axis spatial resolution in the measurements once the differential measurement scheme is utilized among the sensor rings 301 to 305, as will be described in detail later. In addition, another major improvement that would reduce the incidence angle α of the flux lines passing through the sensor rings would be required in order to achieve high sensitivity and high SNR for signal measurements of the thickness changes for both tubing 101 and casing 103.

Figure 3B:
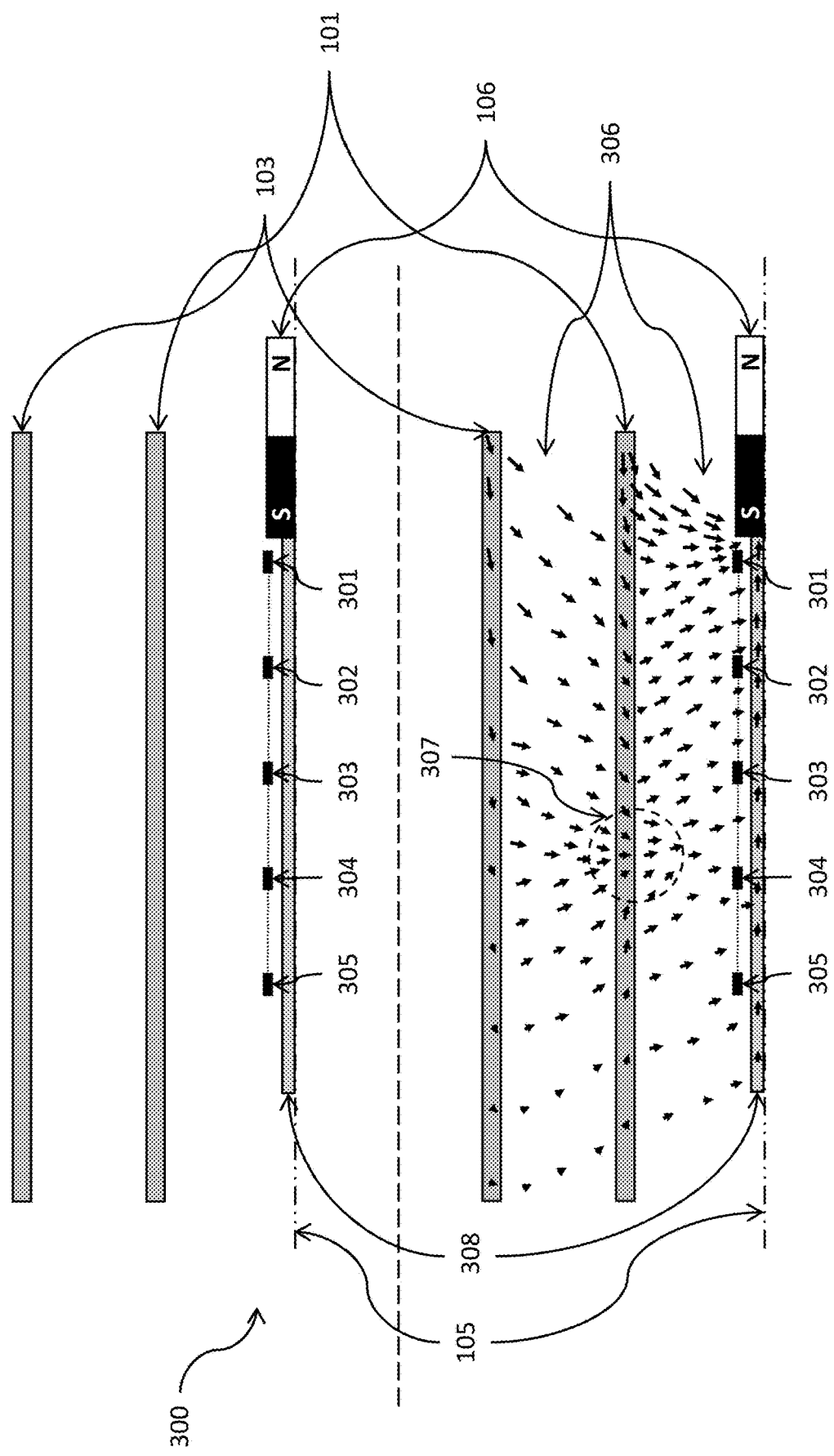
FIG. 3b is a block diagram illustrating a magnetic flux guide lens that guides magnetic flux distribution lines from the outer casing pipe towards magnetic flux measurement sensor rings to enhance casing signal sensitivity and enable through tubing measurements for both tubing and casing, according to an exemplary embodiment of the present invention.

FIG. 3b illustrates an implementation of the disclosed method and apparatus to overcome the aforementioned challenges with conventional systems according to an exemplary embodiment of the present invention. FIG. 3b illustrates the guided magnetic flux distribution using the disclosed magnetic flux guide lens of the disclosed apparatus to enhance measurement sensitivities and SNR. Typically, the magnetic flux guide lens can be a passive or active magnetic device that can guide and/or alter the magnetic flux flows in order for magnetic flux redistributions or concentrations for measurement SNR enhancements. Due to the nature of the magnetic flux loop characteristics, the magnetic flux guide lens can be placed in any sections/locations of the flux loops to achieve the functions of guiding and altering the flux flows for SNR improvements. In an implementation of the disclosed apparatus and method, the magnetic flux guide lens 308 can be inserted underneath the sensor rings. One of the ends of the magnetic flux guide lens 308 can be directly connected mechanically to a south pole of the magnetic field source 106. This arrangement of the magnetic flux guide lens 308 i.e., linked to the south pole and placed underneath along the length of the sensor rings, is presented as a means to guide casing B field flux lines 306 in order to boost the overall flux density distribution level and shift the 'half-half' region 307 towards the center of sensor rings 302, 303, 304, and 305 to enhance their sensitivity and SNR. Such an arrangement also reduces the flux line incidence angles and improves the lateral spatial resolution when a differential measurement scheme is utilized for achieving high fidelity thickness imaging measurements for both tubing 101 and casing 103. The magnetic flux guide lens can be made of any suitable ferromagnetic materials that may have high magnetic permeability, for example Nickel Ferrite, exhibits very high magnetic permeability values. As stated in Equation (2.8), high permeability is inversely proportional to the reluctance of the magnetic flux loop of magnetic B field. With the lens 308 placed underneath the sensor rings, the returning flux lines 306 follow the paths with low magnetic reluctance due to high permeability. The FEM simulation results show that after placing the magnetic guide lens underneath the sensor rings, more flux lines move to the left side of the sensor ring area, shown as the same shifted region 307, as compared to the case shown in FIG. 3a without the magnetic guide lens 308. In addition to the overall flux density distribution level increase, shifting the region 307 to the center area above the sensor rings balances measurements in such a way that measurements from the sensor rings 301 and 302 mainly correspond to the tubing 101 thickness changes while measurements from the sensor rings 304 and 305 mainly correspond to the casing 103 thickness changes. A high lateral spatial resolution from the sensor rings can also be achieved with a differential measurement scheme, as will be described in detail later. The FEM simulation results also show that the flux lines incidence angles are reduced substantially due to the insertion of the guide lens 308 which, based on the equation (3.1), will boost the measurement signal levels, and thus increase the measurement sensitivity and SNR. The cross-section area and profile of the high permeability magnetic flux guide lens 308, which will be described in detail in FIG. 7 as the preferred embodiments of the present invention, can also be designed to achieve balance between the overall flux density level and measurement signal dynamic ranges for all sensor rings such that high-enough sensitivity and SNR for different pipe sizes and thicknesses in various well configurations are maintained.

In summary, with the insertion of predesigned magnetic flux guide lens 308, the performance of the entire measurement system 100 can be greatly improved in terms of measurement signal sensitivity and SNR as the result of increasing the overall flux density distribution across all sensor rings, balancing respective measurements from sensor rings for sensing thickness changes from the tubing 101 and casing 103, reducing flux lines' incidence angles with respect to sensor rings from 301 to 305, and optimizing signal dynamic ranges among all the sensor rings for wide ranges of downhole well configurations with different pipe sizes and thicknesses.

Figure 4:
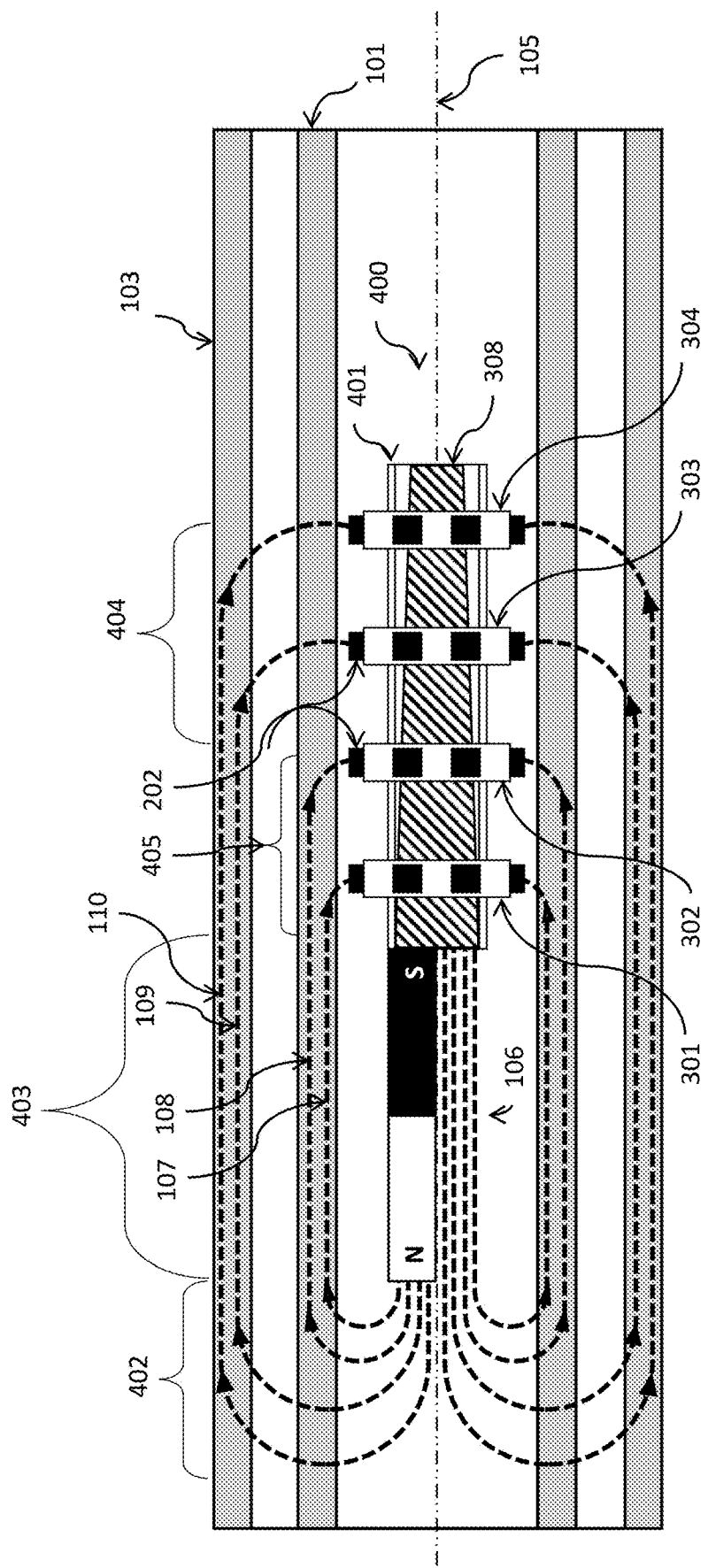
FIG. 4 illustrates a magnetic flux transducer including a strong magnetic source, multiple magnetic flux sensor rings, and a magnetic flux guide lens for enabling through-tubing inner tubing and outer casing pipe thickness measurements, according to an exemplary embodiment of the present invention.

FIG. 4 illustrates a magnetic transducer 400 with the built-in magnetic guide lens 308 as the preferred embodiments of the present invention and outlines an exemplary arrangement of the transducer that enables tubing and casing thickness imaging measurements conducted through-tubing. The said magnetic transducer is mounted on a nonmagnetic support structure 401 and is placed in the same measurement environment as described in FIG. 1—that is, centralized along the axis 105 of the cylindrical inner tubing pipe 101 with an outer cylindrical casing pipe 103 placed concentrically outside of the tubing pipe 101. A magnetic source 106 may provide a constant vectoral magnetic B field flux line distribution which forms the closed loops 107, 108, 109, and 110 that travel through the tubing 101 and casing 103, respectively. Magnetic field source 106 can be any source capable of producing a constant magnetic field, with the one example being a strong rare-earth permanent magnet. Four sensor ring rings 301, 302, 303, and 304, as an example, are placed a certain distance away from the magnetic source 106 and are sensing casing and tubing pipe B field flux returning lines 107, 108, 109, and 110. A magnetic guide lens 308, with a predesigned tapered down profile, may be placed along the whole length of sensor ring rings and may be used to guide the magnetic flux distribution loops from both casing 103 and tubing 101 pipes so as to enhance ring sensitivity and SNR, as shown in FIG. 3b, and to allow through-tubing and casing pipe imaging measurements.

When magnetic flux lines 107, 108, 109, and 110 flow through the tubing 101 and casing 103 in response to the magnetic B field distributions generated by the magnetic field source 106, they form closed loops as they travel from north pole of the magnetic field source 106 to the south pole. As illustrated, the closed flux loops 107, 108, 109, and 110 pass through regions 402, 403, 404, and 405 that include metal pipes and air gap(s). Combining regions 402, 403, and 405 for all the flux loops will build up a spatial measurement aperture of the transducer 400 for the sensor rings 301 to 302 that provide thickness measurements of the tubing 101. Similarly, combining regions 402, 403, 405, and 404 will provide the measurement aperture of the transducer 400 for the sensor rings 303 to 304 that provide thickness measurements of the casing 103. Any metal pipe thickness changes corresponding to the associated spatial aperture will change the flux density distribution measurement outputs. Theoretically, the lateral spatial resolution shall be half the length of measurement aperture of the transducer 400. Upon closer examination of the region 402, each of the flux loops from 107 to 110 travels different lengths of air gaps and metal pipe lengths, which results in different magnetic reluctances between the loop 107 and loop 108 for the tubing 101 as well as between the loop 109 and loop 110 for the casing 103. Such reluctance differences due to different lengths of the loops in the region 402 will then contribute to differences in signal measurements from different sensor rings measuring flux density distribution. However, the measurement differences caused by different reluctances due to different lengths of the loops in the region 402 are not associated with the metal pipes' thickness changes and therefore bear no useful measurement information. In the region 403, the flux loops are concentrated inside tubing and casing pipes and pass through the same area of the pipes. That is, due to tubing flux loops 107 and 108 and casing flux loops 109 and 110 passing through the same area and length of tubing 101 and casing 103 pipes, thickness changes in the region 403 cannot cause significant signal measurement differences between the loop 107 and loop 108 for the tubing 101 as well as between the loop 109 and loop 110 for the casing 103, respectively. Consequently, signal measurement contributions from the region 403, which can be labeled as the region of the common mode signal (CMS), are also not especially useful for the entire flux loop measurements associated with pipe thickness changes. For the tubing loops 107 and 108 passing the tubing within the region 405, the air gap distances for the flux loop 107 and the flux loop 108 are similar while the lengths of the traveled paths are largely different due to the spacing between the sensor ring 301 and sensor ring 302. Therefore, thickness changes in the tubing 101 within the region 405 will generate signal measurement differences between the sensor rings 301 and 302. Such signal measurement differences can then be used for estimating relative tubing thickness changes against the tubing nominal thickness.

For the casing 103, the CMS regions are 403 and 405 since flux loops 109 and 110 passing through these regions travel through the same area and same length of the pipe. Within the region 404, differences in measurements for casing 103 thickness changes result from the length differences of the paths traveled by the flux loops 109 and 110 due to the spacing between the sensor ring 303 and sensor ring 304. Similar to region 405 for the tubing thickness measurements, the region 404 can be used for the casing thickness change evaluations.

Since a strong magnetic field source is required to generate a strong initial B field distribution for the transducer 400 measurements and given the limited space for a downhole tool to conduct measurements inside the tubing 101, the magnetic field source 106 with a long length is utilized to meet these requirements. As the result of this, the length of the common mode signal region 403 is longer compared to the lengths of the other regions 402, 404, and 405. Consequently, measurement apertures for both tubing 101 and casing 103 become large and lateral spatial resolutions become low. Moreover, the CMS portion from the region 403 is dominant within the total measured signals for the sensor rings 301 and 302 for the tubing 101 as well as for the sensor rings 303 and 304 for the casing 103, which will mathematically reduce the sensitivity of measurements and the efficiency of signal channels for the signal digitization processes even though the overall SNR remains high. In order to reduce the given measurement aperture to boost spatial resolution, removing the CMS portion, and, as the result, boosting measurement sensitivity, a differential measurement scheme may be needed. To achieve high lateral spatial resolution and measurement signal sensitivity for given required SNR, careful engineering designs for the sensor modules, spacing arrangements, and the tapered-down flux guide lens are essential.

Figure 5:
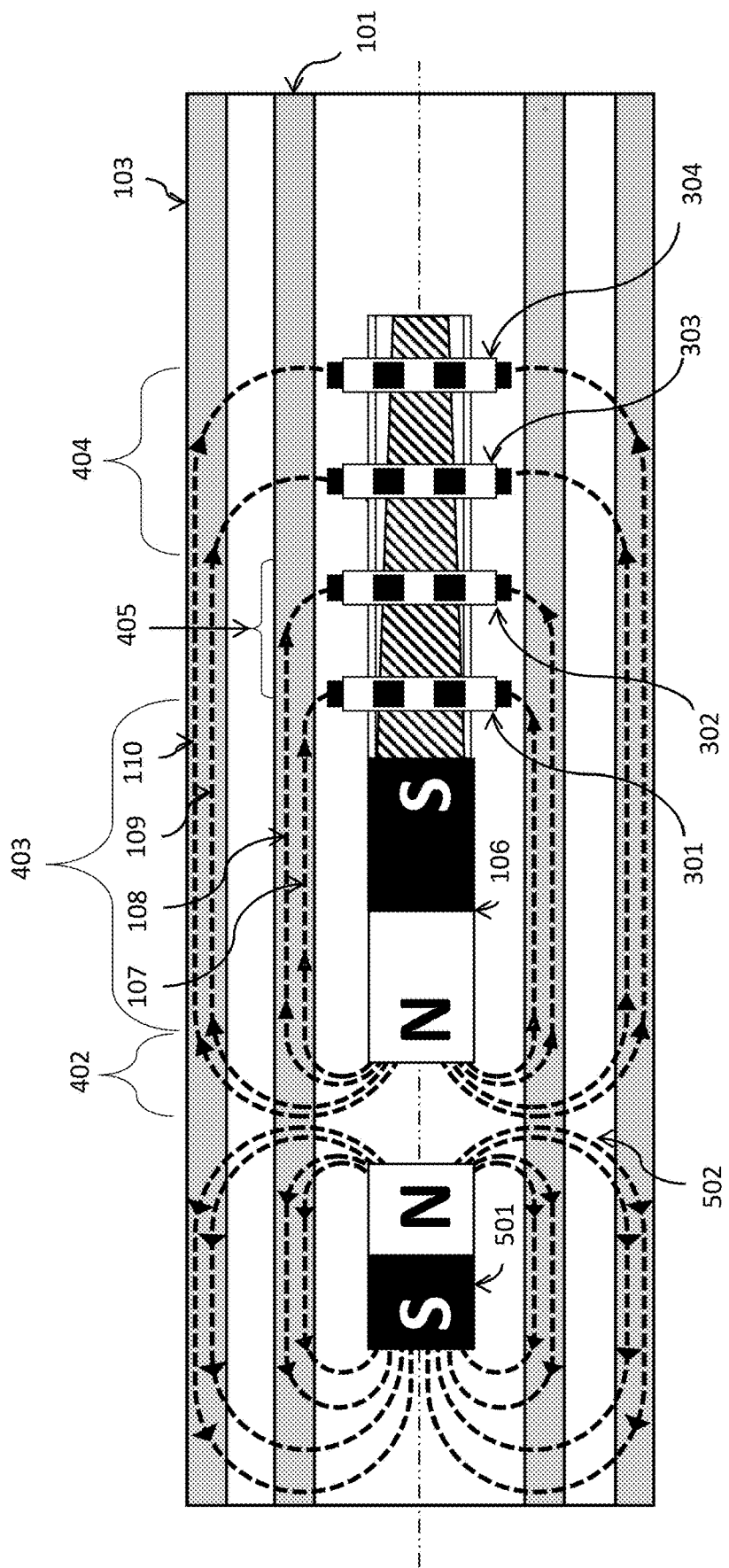
FIG. 5 is a block diagram illustrating an implementation of the apparatus having a secondary magnetic field source for magnetic flux compression, according to an exemplary embodiment of the present invention. The secondary magnetic field source when placed at an optimal location with respect to the primary magnetic field source results in a higher flux density of the magnetic field to propagate along the outer casing pipe which in turn results in a higher sensitivity and SNR of the sensor rings. The secondary magnetic field source can be positioned physically in an opposite direction against the magnetic field polarization of the primary magnetic field source.

FIG. 5 illustrates another possible configuration of the preferred embodiments that may further enhance the measurement signal sensitivity and SNR of the differential scheme mentioned earlier for all sensor rings 301, 302, 303, and 304 by adding a secondary magnetic source 501 to the left side of the magnetic source 106. Assuming that measured signals from sensor rings 301, 302, 303, and 304 for the densities of the flux loops 107, 108, 109, and 110 are $V_A$, $V_B$, $V_C$, and $V_D$, respectively, the differential scheme for the outputs can be shown as:

$$v_T = V_A - k_T V_B \text{ and } v_C = V_C - k_C V_D \quad (4)$$

where $v_T$ is the differential measurement output mainly corresponding to thickness changes in the tubing 101, $v_C$ is the differential measurement output mainly corresponding to thickness changes in the casing 103, and $k_T$ and $k_C$ are weight coefficients that need to be calibrated to remove measurement signal differences from the regions 402 and 403 as the CMS for the tubing 101 and regions 402, 403, and 405 as the CMS for the casing 103. As described in FIG. 4, when tubing B field flux lines 107 and 108 that are generated from the magnetic source 106 pass the region 402, the lengths between 107 and 108 are different, which results in the difference of reluctances for both the flux line 107 and the flux line 108. Similarly, when casing B field flux lines 109 and 110 pass through the region 402, similar reluctance difference exists between the flux line 109 and flux line 110. However, as mentioned earlier, such differences are not related to thickness changes of the tubing 101 or casing 103 but instead result from the difference in length of the said flux loops. Nevertheless, these differences will impact the differential measurements $v_T$ and $v_T$ from the Equation (4). With the addition of the secondary magnet 501 and its own corresponding magnetic B field distribution 502, the flux loops of the magnetic B field in the region 402 are compressed. As shown, the length of the loop 108 is compressed to be closer to the length of the loop 107 for the tubing 101 while the length of the loop 110 is compressed to be closer to the length of the loop 109 for the casing 103 in the region 402. As the result of this field compression, the reluctance of the flux loop 107 is close to the one of flux loop 108 for the tubing 101 while reluctance of the flux loop 109 is close to the one of flux loop 110 for the casing 103, resulting in the reduction of signal differences in the region 402. This improvement in turn significantly reduces impact on the differential measurements shown in Equation (4). In the region 403, as discussed in FIG. 4, little impact from the compressional magnet 501 is caused to flux loops from 107 to 110 and thus, the portion of measurement signals for the flux loops 107 and 108 in the region 403 for the tubing 101 as well as the portion of measurement signals for the flux loops 109 and 110 in the regions 403 and 405 for the casing 103 is the same CMS, respectively, when the differential measurement scheme is used. Therefore, the only differences between the flux loops 107 and 108 in the region 405 for the tubing 101 and between the flux loops 109 and 110 in the region 404 for the casing 103 are related to thickness changes of the tubing 101 and casing 103. As mentioned earlier, the magnetic B field distribution from the magnetic source 106 is compressed by the B field distribution 502 from the secondary magnet 501 towards the right direction, as shown in the FIG. 5. Such compression not only results in flux loops' length matching in the region 402, but also forces higher density of flux lines in the region 405 for the magnetic density measurement of the tubing 101 as well as in the region 404 for the magnetic density measurement of the casing 103. This results in higher SNR of the flux density measurement signals as compared to the SNR of the signals without the addition of the secondary magnetic source 501.

It then follows that by adding the compressional magnet 501, the differential measurement scheme in Equation (4) becomes more sensitive to thickness changes of the tubing 101 in the region 405 and of the casing 103 in the region 404. Using both the differential measurement scheme and compressional magnet 501, the transducer aperture can be also reduced to the length of the region 405 for the tubing 101 and the length of the region 404 for the casing 103 as opposed to much longer total apertures shown in FIG. 4. The combination of differential measurement scheme shown in Equation (4) and compressional magnet 501 also improves the spatial resolution in the lateral direction for thickness image measurements of both tubing 101 and casing 103.

Figure 6:
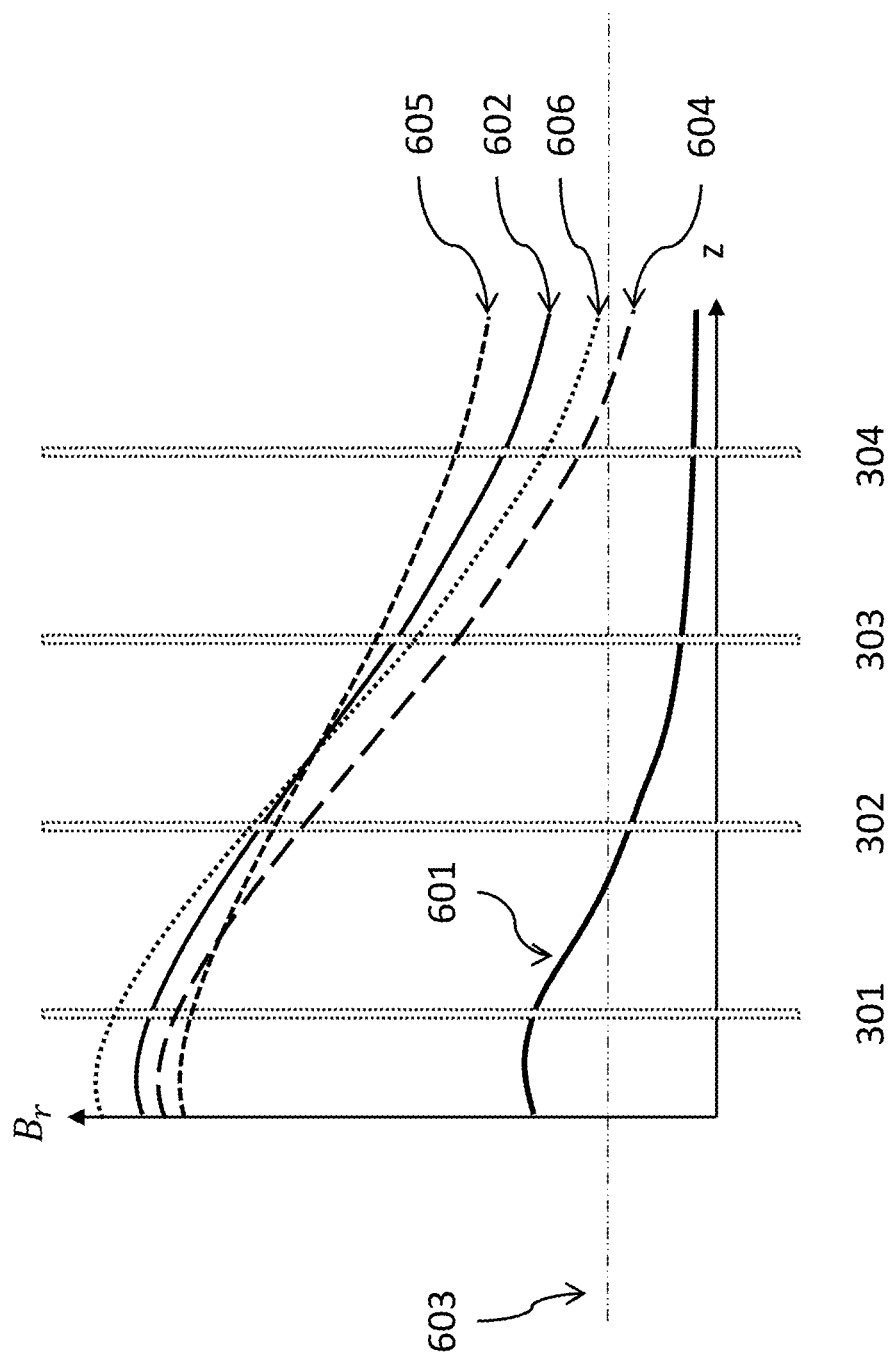
FIG. 6 is a graph illustrating a comparison of sensitivity and SNR performance between magnetic transducers employing sensor rings with magnetic flux guide lens and magnetic field compression versus without magnetic flux guide lens and magnetic field compression, according to an exemplary embodiment of the present invention.

FIG. 6 provides a graphical comparison of the improvements of the measurement outputs from the sensor rings from 301 to 304 for the flux density distribution along the lateral direction of the magnetic transducer apparatus without the magnetic flux guide lens and flux field compression versus the magnetic transducer apparatus with the enhanced magnetic guide lens and flux field compression thoroughly described as the preferred embodiments of the present invention. As illustrated, a comparison in measurement signal sensitivity responses of sensor rings 301, 302, 303, and 304 is presented. The y-axis $B_r$ is the radial component of B field, traveling through tubing 101 and casing 103 pipes, which is sensed by sensor rings, and z is the distance along which the sensor rings 301, 302, 303 and 304 are placed. The measurement system noise floor line is shown as 603, signifying a region below which the signal response from sensor rings cannot be measured due to sensor response being dominated by noise from the electronic networks connected to the sensor rings as the result of the low signal level of measurements due to the poor sensitivity. The FEM modeling simulation results show that for the magnetic transducer with enhanced flux guide lens and flux compression, the $B_r$ density distribution in curve 602 along the lateral direction over the area of sensor rings for given nominal values of the thicknesses for both the tubing 101 and casing 103 is much higher and more linear above the noise floor 603 than the $B_r$ density distribution response in curve 601 for the magnetic transducer without the magnetic guide lens and flux compression shown in FIG. 4 given the same pipe geometries. The signal measurement sensitivity curve 602 illustrates a high-sensitivity, high linearity response across all sensor rings while maintaining high positive SNR as the result of increased flux density of $B_R$ field lines passing through the sensor rings 301, 302, 303 and 304 due to the action of the magnetic flux guide lens 308 and compressional action of the secondary magnetic field source 501, shown in FIG. 5. In contrast, the sensitivity curve response 601 illustrates a nonlinear dynamic range distribution, lack of sensitivity, and poor SNR of $B_R$ field flux distribution responses, thus rendering through-tubing casing thickness imaging measurements impossible to achieve.

FIG. 6 also illustrates the $B_R$ field flux distribution responses corresponding to different cases of pipe thickness reductions wherein the curve 605 illustrates thickness reduction response for tubing-only pipe, the curve 606 illustrates the thickness reduction response for casing-only pipe and the curve 604 illustrates the thickness reduction response for both tubing and casing pipes. The sensor rings from 301 to 304 are placed in locations with predefined spacings to measure the $B_R$ field flux densities of the curves. The differential measurement scheme in Equation (4) is used for estimating thickness values for both pipes with the inversion of the signal measurements from the sensor rings.

FIG. 7 illustrates various configurations of structures of the previously described magnetic flux guide lens 308. Without any limitations, the magnetic flux guide lens 308 can be shaped and sized in any suitable geometrical combination that achieves the best performance for the magnetic flux transducer that would provide the best sensitivity and SNR. As illustrated, the magnetic flux guide lens may be made in the shape of a conical cylinder with a tapered angle as in 701, in the shape of a cylinder with a certain length and diameter as in 702, in the shape of a polygonal shaped bar as in 703 or in the shape of a cylinder with a variable tapered profile along its length as in 704. It shall be assumed that geometrical proportions of the said magnetic guide lens can be different from the exemplary embodiment shapes described above and can be shorter, wider, narrower or any combination thereof as dictated by application requirements.

Figure 8:
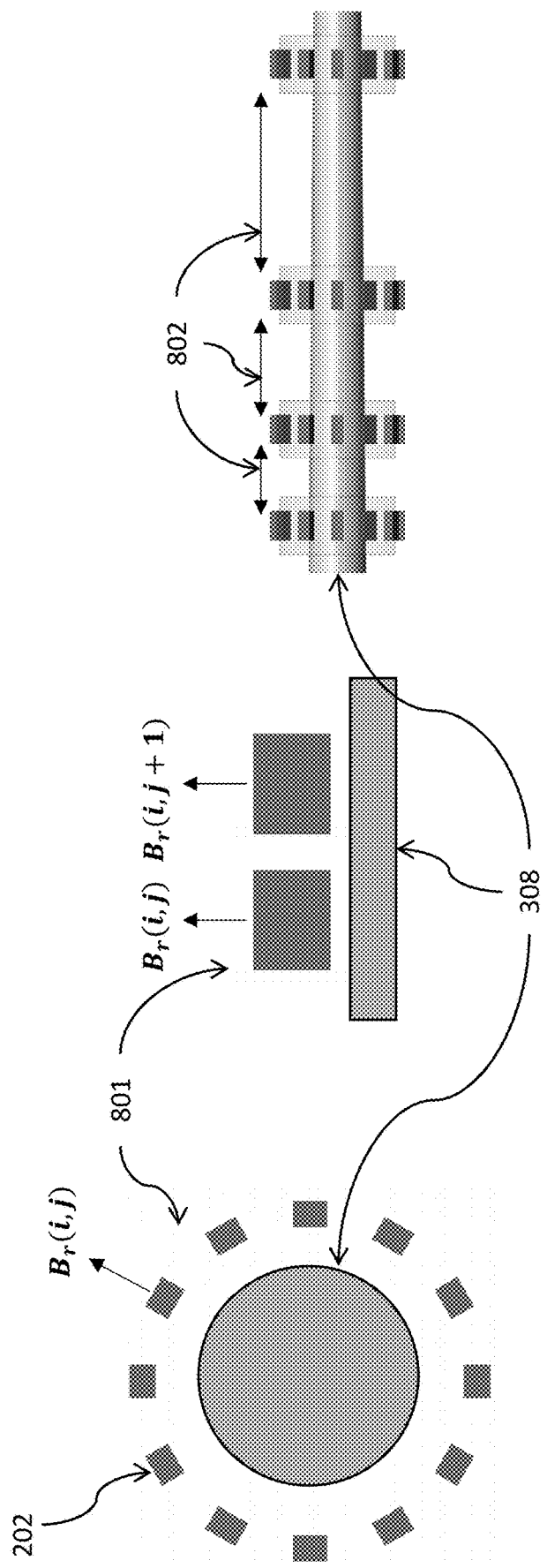
FIG. 8 illustrates a sensor ring arrangement as part of the magnetic transducer design with different predefined spacings between sensor rings that optimize sensor magnetic flux reception, sensitivity, and SNR, according to an exemplary embodiment of the present invention.

FIG. 8 illustrates an exemplary arrangement of sensor rings for the receiving section of the magnetic transducer apparatus as part of the present invention that senses return $B_R$ field flux densities in a radial direction arriving from tubing 101 and casing 103 pipes and provides highly sensitive tubing and casing thickness data with high azimuthal resolution. As illustrated, each individual sensor ring 801 comprises a plurality of individual magnetic flux measurement sensors 202 positioned to sense and measure the $B_r$ field flux densities. A plurality of sensors 202 placed a certain distance away from each other and arranged in a circular ring to enable a high degree of spatial azimuthal resolution when measuring $B_r$ field lines arriving from tubing 101 and casing 103 pipes. As thoroughly described in FIG. 2, spatial azimuthal resolution of each sensor ring is a function of the number of individual sensors 202 per ring 801 with the higher number of sensors resulting in the higher spatial azimuthal resolution, shown in Equation (3.2). A cylindrical magnetic flux guide lens 308 is placed inside the sensor ring 801 so as to guide the $B_r$ field from tubing 101 and casing 103 pipes and increase flux density when passing through the magnetic flux measurement area of sensors 202 to enhance their sensitivity and maintain high SNR. Each individual sensor ring 801 may be placed a certain spacing 802 away from each other and may be placed closer or farther away in order to optimize sensitivity and dynamic range, in either the absolute or differential measurements, depending on various measurement configurations such as different diameters and thicknesses of tubing 101 and casing 103 pipes.

Figure 9:
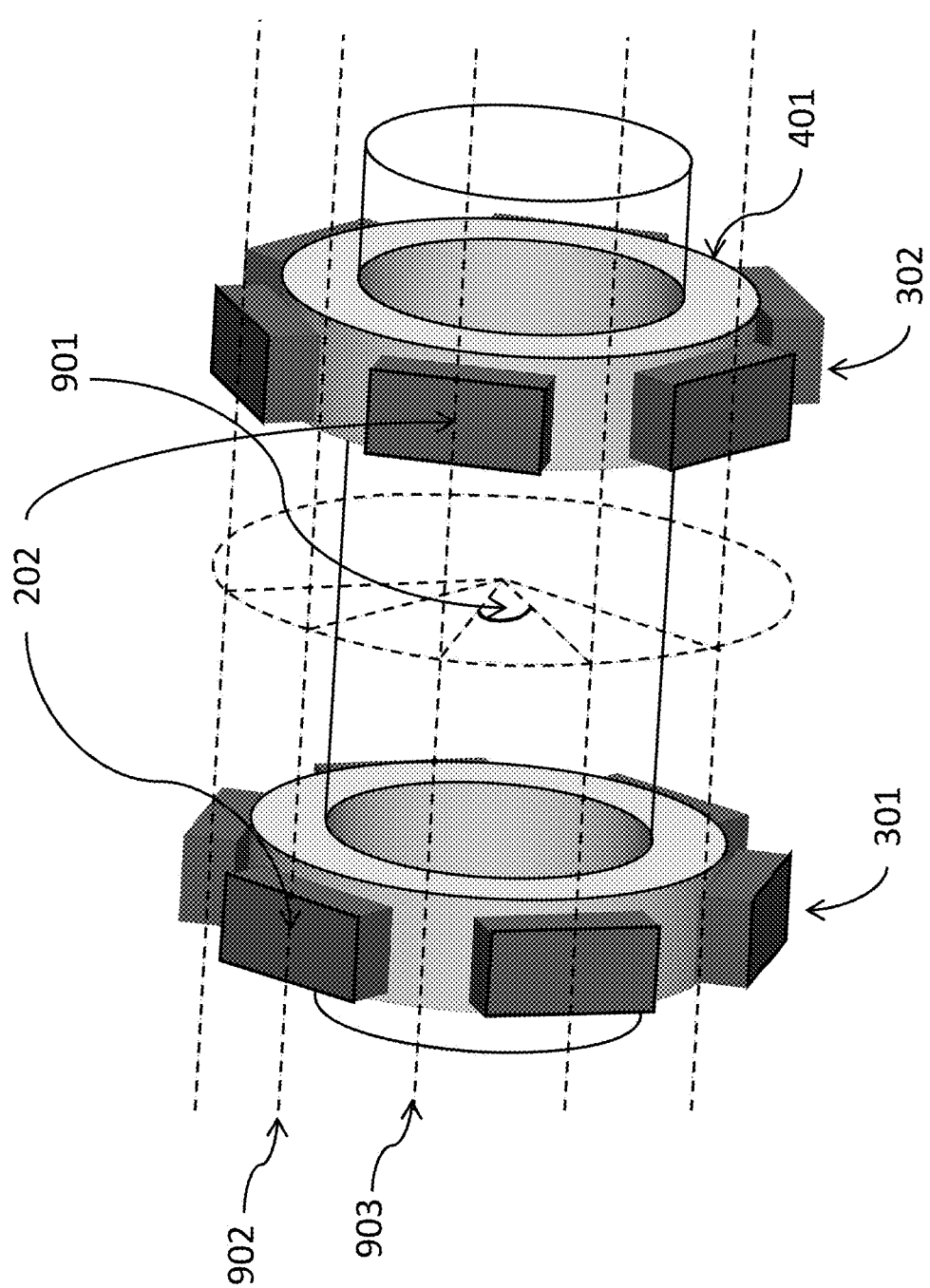
FIG. 9 illustrates a method for enhancing azimuthal spatial resolution and coverage of the magnetic transducer by arranging sensor rings in a specific way as to provide an angular offset between each of the senor rings in a matrix to construct a triangular sampling scheme, according to an exemplary embodiment of the present invention.

FIG. 9 illustrates another exemplary arrangement of magnetic flux sensor rings as part of the present invention that allows for increased spatial azimuthal resolution of the said rings to achieve higher quality thickness imaging measurements of tubing 101 and casing 103. Such measurement arrangement may then be combined with a method for processing the measured samples from the sensor rings to yield higher azimuthal resolution in the output thickness images for tubing 101 and casing 103. As introduced and described in FIG. 2, spatial azimuthal resolution of any given ring follows Equation (3.2) which states that azimuthal resolution of a given sensor ring is a function of the number of individual sensors, with the higher number of sensors per ring resulting in higher azimuthal resolution. Considering the fact of the structural geometry constraints of the magnetic transducer apparatus, a sensor ring has a fixed diameter and surface area on which each individual sensor 202 can be placed radially with each individual sensor occupying a fraction of the said area. Therefore, only a finite number of individual magnetic flux measurement sensors 202 can be placed, which results in a certain degree of azimuthal resolution that is a function of the ring diameter, surface area of the individual sensor 202 and spacing between each of the sensors. As mentioned, the azimuthal resolution of the measured thickness images of tubing 101 and casing 103 from the sensor rings follows Equation (3.2) and expressed in angular radians. According to the present invention, an exemplary arrangement and a method can be implemented that uses multiple adjacent sensor rings for sampling measurements, for example M sensor rings, with the certain identical angular offsets among the said sensor rings to enhance the azimuthal resolution. The angular offsets can be identical and placement of the sensor rings with the said angular offset can be arranged in sequential order. In theory, the azimuthal resolution will then be enhanced by M times after processing the measurement samples. Each sensor ring is placed with the angular offset determined by $$\text{Angular offset in radians} = \frac{2\pi}{M \times N} \quad (5.0)$$

As an example, shown in FIG. 9, two adjacent sensor rings (N=2) with the angular offset 901 as $\pi/M$ from Equation (5.0) are arranged. As a result, the azimuthal resolution is improved by 2 times. In FIG. 9, sensor rings 301 and 302 shown are mounted on a support structure (body) 401 in a specific way that provides an angular offset 901 of the sensor ring 302 with respect to the sensor ring 301. Specifically, the sensor ring 301 is mounted in such a way that an individual magnetic flux measurement sensor 202 is placed centralized along the axis 902, which may be referred to as the zero-degree default position axis for the sensor ring 301. Meanwhile, the sensor ring 302 may be mounted in a different way such that the individual magnetic flux measurement sensor 202 is arranged with the angular offset away, shown in 901, from the initial position along the axis 902 and is now placed centralized along the new offset axis 903. Measurements sampled from the initial position sensors mounted on sensor ring 301 and the shifted position sensors mounted on sensor ring 302 can then be processed in the digital domain using the triangular sensor scheme to extract higher combined azimuthal resolution for the output thickness image of the tubing 101. Similarly, the casing 103 thickness imaging azimuthal resolution can be enhanced in an identical way by offsetting the sensor ring 304 from sensor ring 303 position by a specified number of degrees and applying the triangular sensor scheme in the post-processing domain which will be described in detail below.

Figure 10:
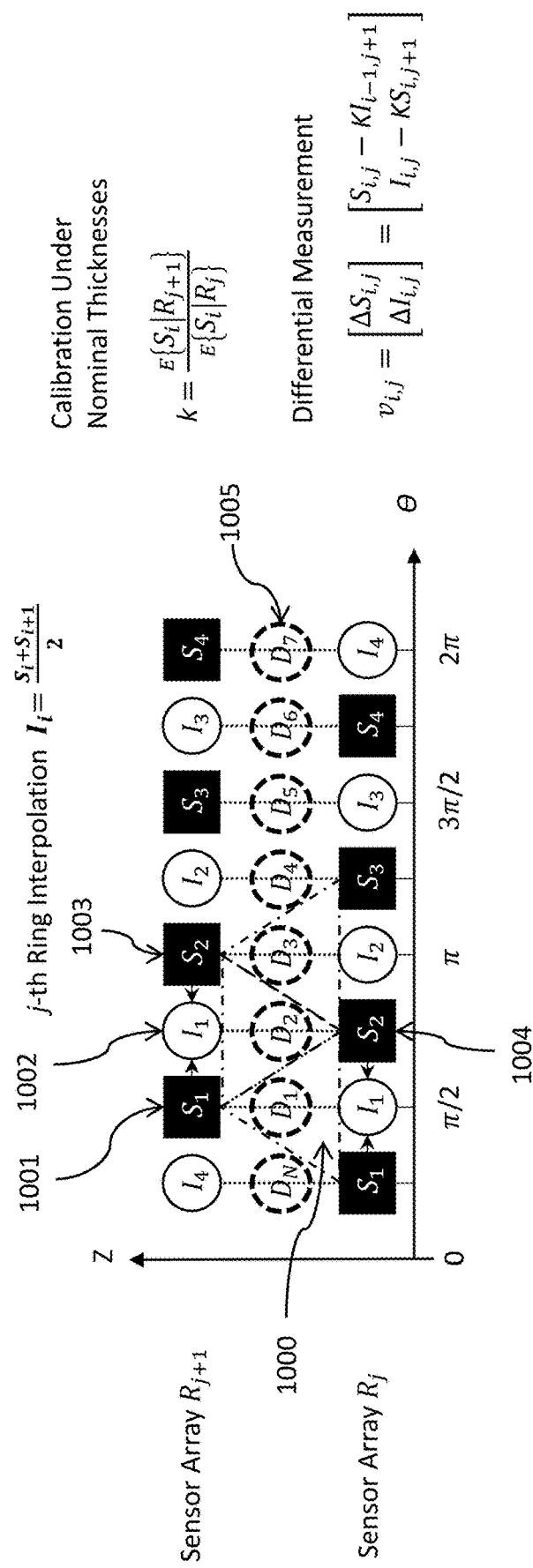
FIG. 10 further illustrates a concept and method of employing a triangular sampling scheme and sample interpolation along with the differential measurement of multiple transducer rings to achieve higher spatial resolution of the system in the post-processing domain, according to an exemplary embodiment of the present invention.

FIG. 10 graphically illustrates the aforementioned method of sensor triangular sampling scheme 1000 that can be used to enhance the spatial azimuthal resolution of sensor rings in order to provide higher quality tubing and casing thickness imaging results. As illustrated, a circular receiving sensor ring $R_j$ comprises a plurality of individual sensors $S_1$, $S_2$, $S_3$, and $S_4$ that are placed radially along the sensor ring and each produce unique output levels as they sense the flux density distributions of magnetic field $B_r$. Similarly, an adjacent circular sensor ring $R_{j+1}$ that is placed with the angular offset 901, shown in FIG. 9, from sensor ring $R_j$ comprises a plurality of individual sensors $S_1$, $S_2$, $S_3$, and $S_4$. When analyzed in detail from a positional perspective with respect to each other, it is evident that an individual sensor 1004 from the sensor ring $R_j$ is placed equally in azimuthal angle in between the two sensors 1001 and 1003 from the sensor ring $R_{j+1}$ as the result of an angular shift of the sensor ring $R_{j+1}$. Such an arrangement forms a triangular relationship between outputs from these sensors that allows the use of a triangular sensor sampling scheme to enhance the azimuthal resolution. As illustrated, readings $S_1$ and $S_2$ of the sensors 1001 and 1003 from the sensor ring $R_{j+1}$ can then be linearly interpolated as the sample reading $I_1$ for the azimuthal location 1002 by $$I_i = \frac{S_i + S_{i+1}}{2} \quad (5.1)$$

Then, the differential scheme shown in Equation (4) can be rewritten as $$[v_{i,j}] = \begin{bmatrix} \Delta S_{i,j} \\ \Delta I_{i,j} \end{bmatrix} = \begin{bmatrix} S_{i,j} - kI_{i-1,j+1} \\ I_{i,j} - kS_{i,j+1} \end{bmatrix} \quad (5.2)$$

$$\text{where,} \quad k = \frac{E\left\{\frac{S_i}{R_{j+1}}\right\}}{E\left\{\frac{S_i}{R_j}\right\}} \quad (5.3)$$

As illustrated in FIG. 5, for both pipe thickness image measurements, the sensor rings from 301 to 302 for the tubing 101 and sensor rings from 303 and 304 for the casing 103 are used, and Equation (4) becomes, $$[v_T(i)] = [V_{301}(i) - k_T V_{302}(i)] \quad (5.4)$$

$$[v_C(i)] = [V_{303}(i) - k_C V_{304}(i)] \quad (5.5)$$

for the thickness image measurement outputs $[D_T(i)]$ and $[D_C(i)]$ for the tubing 101 and casing 103 in FIG. 1. Therefore, for the differential scheme, the measurement outputs shall follow the Equations (5.4) and (5.5) for the tubing 101 and the casing 103, respectively, as the examples for both pipes in $$\begin{pmatrix} [D_T(2i)] \\ [D_T(2i+1)] \end{pmatrix} = \begin{cases} \left[\frac{S_{301}(i+1)}{2} - k_T \frac{S_{302}(i) + S_{302}(i+1)}{4}\right] \\ \left[\frac{S_{302}(i+1)}{2} - k_T \frac{S_{301}(i+1) + S_{301}(i+2)}{4}\right] \end{cases} \quad (5.6)$$

$$\begin{pmatrix} [D_C(2i)] \\ [D_C(2i+1)] \end{pmatrix} = \begin{cases} \left[\frac{S_{303}(i+1)}{2} - k_C \frac{S_{304}(i) + S_{304}(i+1)}{4}\right] \\ \left[\frac{S_{304}(i+1)}{2} - k_C \frac{S_{303}(i+1) + S_{303}(i+2)}{4}\right] \end{cases} \quad (5.7)$$

In order for triangular sensor interpolation to work reliably under different application conditions such as variable pipe thicknesses in real measurement environments, a calibration process for $k_T$ and $k_C$ for the differential measurement scheme with a known combination of various pipe thicknesses of nominal values with no thickness reduction must be performed to derive a calibration factor to scale received readings from sensors and accurately derive interpolated readings for azimuthal resolution enhancement of sensor rings.

Figure 11:
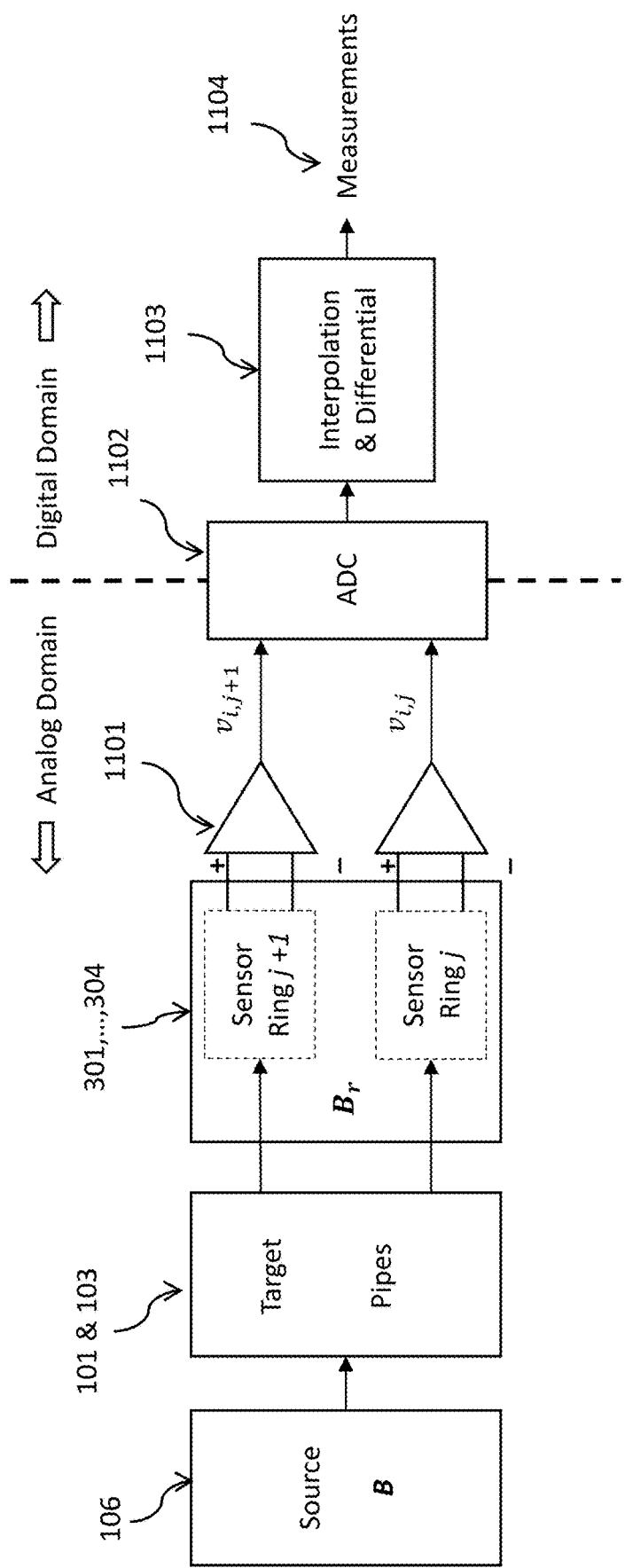
FIG. 11 further depicts a system signal flow diagram from the source to final pipe thickness imaging deliverables to illustrate advantages of sample interpolation and differential measurement schemes, according to an exemplary embodiment of the present invention.

FIG. 11 illustrates a block diagram of the measurement system using the magnetic transducer apparatus with the absolute or differential measurement scheme thoroughly described as the preferred embodiments of the present invention that employs triangular sample interpolation and sensor ring differential measurements necessary to obtain through-tubing and casing pipe thickness imaging measurements with high degree of azimuthal resolution. As illustrated, the magnetic field source 106 provides a constant magnetic field B which generates flux density distribution lines around the source 106 that start flowing from one pole of the magnetic field source 106 to the other. The flux lines enter target tubing 101 and casing 103 pipes as they follow the path of least reluctance as they travel back to the magnetic field source 106. On the receiving end, sensor rings 301, 302, 303 and 304 are used to sense arriving flux lines in $B_r$ from the target pipes 101 and 103. Sensor rings may produce multiple analog outputs that are then fed into the analog circuit network stage 1101 which may consist of several components including, but not limited to amplifiers, resistors, and capacitors that are necessary to scale and condition the received voltage. The processed analog signals are then fed into the analog-to-digital converter 1102 that digitizes the analog signals into the digital signals for further signal post-processing. Digitized signals are then processed in the digital domain 1103 where interpolation and differential measurement algorithms, as shown in FIG. 10 and Equation (5.1) to (5.5), are applied in order to provide final deliverable measurement data 1104 which represents the tubing 101 and casing 103 pipe thickness images with high azimuthal spatial resolution and SNR.

Figure 12:
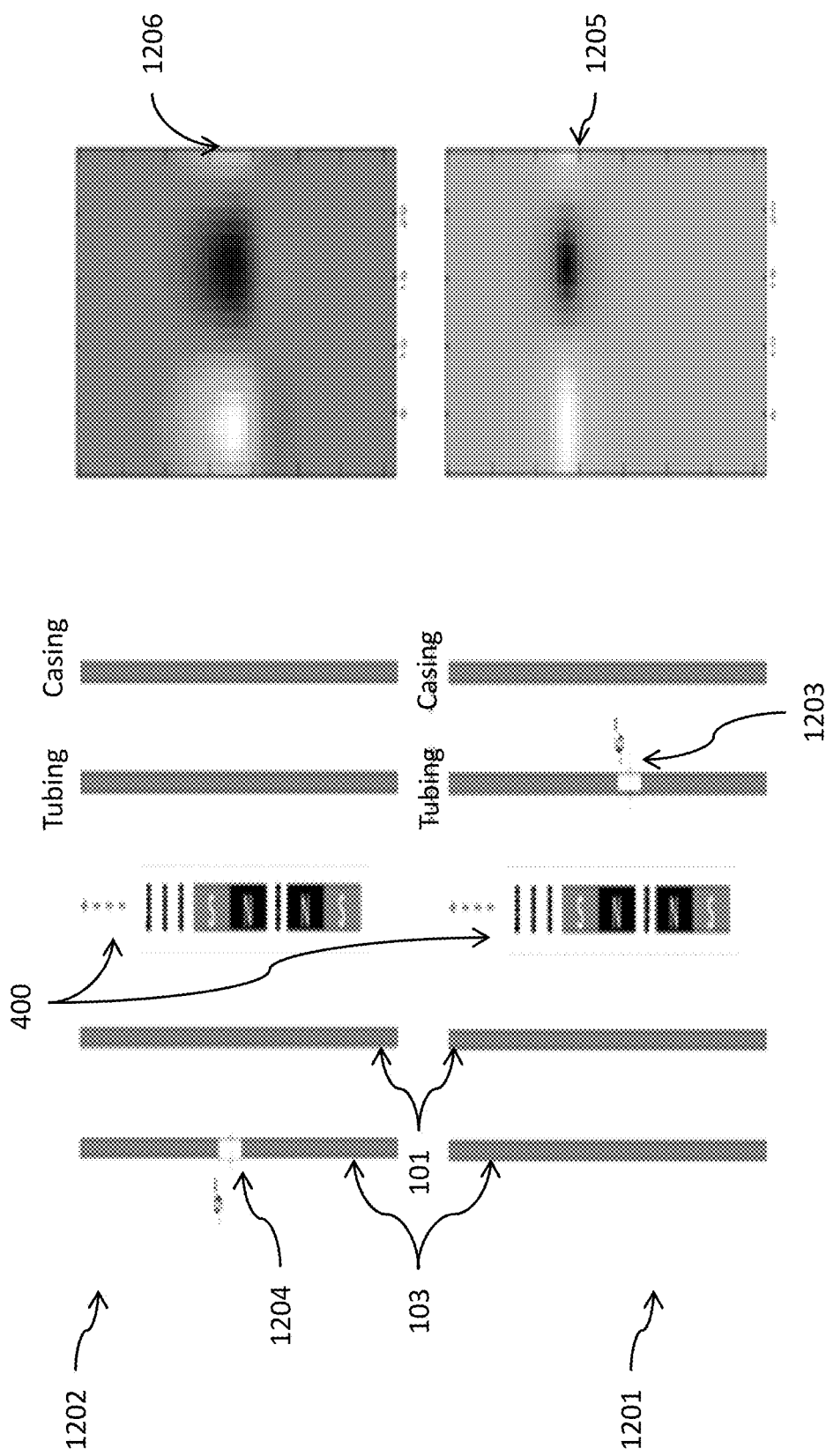
FIG. 12 shows the thickness images from lab transducer confirmation tests for the sensor rings for proof of concept (POC) in the apparatus and method, according to an exemplary embodiment of the present invention.

FIG. 12 displays the lab test results as thickness images from the transducer 400, shown in FIG. 4 and FIG. 5 as the preferred embodiments of the present invention, for sensor rings 301, 302, 303, and 304, respectively. The case 1201 shows a pipe thickness cut 1203 as a defect on the wall of the tubing 101 while the case 1202 shows the thickness cut 1204 as a defect on the wall of the casing 103. The signal responses 1205 for the tubing 101 and 1206 for the casing 103 employing the differential scheme shown in FIG. 6 and Equations (5.6) and (5.7) of signal measurements from the sensor rings 301, 302, 303, and 304 are illustrated. Signal output images 1205 and 1206, measured and post-processed directly from the sensor rings for thickness changes for the tubing or the casing, respectively, clearly show the region of the defect, which indicates that the sensitivity and SNR of signal measurements are high enough. Therefore, the through-tubing tubing and casing thickness measurement concept using the transducer apparatus of the present invention is proven and verified with the lab experimental data.

In one implementation, disclosed is a magnetic sensor ring transducer apparatus and its method of signal acquisition, measurement scheme, and data processing are designed, simulated, and validated in lab tests for through tubing dual steel pipe thickness image measurements. In the new transducer module, the magnetic flux sensor rings comprise the sensor ring that measures the magnetic flux density distribution both in azimuthal and lateral. A built-in magnetic guide lens and compressional magnetic source are designed and configured in order to enhance the signal sensitivity, signal-to-noise ratio, and balance signal dynamic ranges in between the tubing and casing pipes to deliver high quality thickness images for both pipes. The triangle sampling scheme is utilized to improve the image resolution and borehole coverage azimuthally while the differential measurement method, incorporated with designed apparatuses for favorable enhancements of magnetic field flux distribution, is utilized to increase the image lateral resolution. During operation, the transducer as a logging tool is positioned inside the tubing and measures both pipe thicknesses through the tubing wall. The output data after the post-processing will be delivered as thickness images for tubing and casing pipes, respectively.

Although the present invention has been thoroughly described in detail, it should be understood and implied that any modifications and changes that do not depart from the fundamental principle of the present invention as defined in the respective claims section below may be allowed.

What is claimed is:

1. A magnetic flux measurement apparatus for nondestructive thickness imaging testing of metallic objects, the magnetic flux measurement apparatus comprises:
a transducer comprising:
at least one magnetic field source;
one or more magnetic flux sensor rings spatially positioned in alignment with a lateral axis of the at least one magnetic field source; and
a magnetic flux guide lens operably coupled to the at least one magnetic field source and passes through the one or more magnetic flux sensor rings in alignment with the lateral axis of the at least one magnetic field source, wherein the magnetic flux guide lens is of a tapered profile, wherein the magnetic flux guide lens has a proximal end and a distal end, the proximal end is coupled to the at least one magnetic field source, the magnetic flux guide lens tapers from the proximal end towards the distal end.

2. The magnetic flux measurement apparatus according to claim 1, wherein the at least one magnetic field source is a permanent magnet or an electromagnet.

3. The magnetic flux measurement apparatus according to claim 1, wherein the magnetic flux guide lens is coupled to a south or a north pole of the at least one magnetic field source.

4. The magnetic flux measurement apparatus according to claim 1, wherein the magnetic flux measurement apparatus further comprises a secondary magnetic field source spatially positioned geometrically at a predetermined distance away from the at least one magnetic field source in alignment with the lateral axis such that magnetic fields of the secondary magnetic field source and the at least one magnetic field source oppose each other.

5. The magnetic flux measurement apparatus according to claim 1, wherein each ring of the one or more magnetic flux sensor rings comprises:
a body having evenly spaced apart magnetic flux sensors disposed throughout a periphery of the body in azimuthal direction for obtaining azimuthal spatial image measurements.

6. The magnetic flux measurement apparatus according to claim 1, wherein the one or more magnetic flux sensor rings are spatially positioned along the lateral axis with predetermined spacings among them.

7. The magnetic flux measurement apparatus according to claim 1, wherein at least two magnetic flux sensor rings of the one or more magnetic flux sensor rings that are adjacent to each other are oriented at a predetermined angular offset relative to each other for enhancing azimuthal resolution.

8. The magnetic flux measurement apparatus according to claim 1, wherein the magnetic flux guide lens is made of ferromagnetic materials with high magnetic permeability, the ferromagnetic material selected from a group consisting of iron, nickel, cobalt, and a combination thereof.

9. The magnetic flux measurement apparatus according to claim 1, wherein the magnetic flux guide lens is coupled to a north pole or a south pole of the at least one magnetic field source and is configured to guide magnetic field flux lines into a predetermined sensor area of the one or more magnetic flux sensor rings and aligning flux incidence angles in a radial direction.

10. A method for measuring thicknesses and thickness images of multiple concentric metallic pipes, the method comprises:
providing a magnetic flux measurement apparatus, the magnetic flux measurement apparatus comprises:
a transducer comprising:
at least one magnetic field source;
one or more magnetic flux sensor rings spatially positioned in alignment with a lateral axis of the at least one magnetic field source; and
a magnetic flux guide lens operably coupled to the magnetic field source and passes through the one or more magnetic flux sensor rings in alignment with the lateral axis of the magnetic field source, wherein the magnetic flux guide lens is of a tapered profile, wherein the magnetic flux guide lens has a proximal end and a distal end, the proximal end is coupled to the at least one magnetic field source, the magnetic flux guide lens tapers from the proximal end towards the distal end.

11. The method according to claim 10, wherein the at least one magnetic field source is a permanent magnet or an electromagnet.

12. The method according to claim 10, wherein the magnetic flux guide lens is coupled to a south pole or a north pole of the at least one magnetic field source.

13. The method according to claim 10, wherein the magnetic flux measurement apparatus further comprises a secondary magnetic field source spatially positioned geometrically at a predetermined distance away from the at least one magnetic field source in alignment with the lateral axis such that magnetic fields of the secondary magnetic field source and the at least one magnetic field source oppose each other.

14. The method according to claim 10, wherein each ring of the one or more magnetic flux sensor rings comprises:
a body having evenly spaced apart magnetic flux sensors disposed throughout a periphery of the body in azimuthal direction for obtaining azimuthal spatial image measurements.

15. The method according to claim 10, wherein the one or more magnetic flux sensor rings are spatially positioned along the lateral axis with predetermined spacings among them.

16. The method according to claim 10, wherein at least two magnetic flux sensor rings of the one or more magnetic flux sensor rings that are adjacent to each other are oriented at a predetermined angular offset relative to each other for enhancing azimuthal resolution.

17. The method according to claim 10, wherein the magnetic flux guide lens is made of ferromagnetic materials with high magnetic permeability, the ferromagnetic material selected from a group consisting of iron, nickel, cobalt, and a combination thereof.

18. The method according to claim 10, wherein the magnetic flux guide lens is coupled to a north pole or a south pole of the at least one magnetic field source and is configured to guide magnetic field flux lines into a predetermined sensor area of the one or more magnetic flux sensor rings and aligning flux incidence angles in a radial direction.

* * * * *